United States Patent
Choi et al.

(10) Patent No.: US 11,521,987 B2
(45) Date of Patent: Dec. 6, 2022

(54) VERTICAL MEMORY DEVICES

(71) Applicant: Samsung Electronics Co., Ltd., Suwon-si (KR)

(72) Inventors: Ji-Hoon Choi, Seongnam-si (KR); Sung-Gil Kim, Yongin-si (KR); Jung-Hwan Kim, Seoul (KR); Chan-Hyoung Kim, Suwon-si (KR); Woo-Sung Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 100 days.

(21) Appl. No.: 17/195,756

(22) Filed: Mar. 9, 2021

(65) Prior Publication Data

US 2021/0217771 A1  Jul. 15, 2021

Related U.S. Application Data

(63) Continuation of application No. 16/516,756, filed on Jul. 19, 2019, now Pat. No. 10,943,918.

(30) Foreign Application Priority Data

Nov. 30, 2018  (KR) ........................ 10-2018-0152388

(51) Int. Cl.
| | |
|---|---|
| H01L 27/00 | (2006.01) |
| H01L 27/1157 | (2017.01) |
| H01L 27/11582 | (2017.01) |
| H01L 27/11556 | (2017.01) |
| H01L 27/11524 | (2017.01) |

(52) U.S. Cl.
CPC .... H01L 27/11582 (2013.01); H01L 27/1157 (2013.01); H01L 27/11524 (2013.01); H01L 27/11556 (2013.01)

(58) Field of Classification Search
CPC ......... H01L 27/11582; H01L 27/11524; H01L 27/11556; H01L 27/1157
See application file for complete search history.

(56) References Cited

U.S. PATENT DOCUMENTS

| | | |
|---|---|---|
| 6,303,447 B1 | 10/2001 | Chhagan et al. |
| 9,362,301 B2 | 6/2016 | Lee et al. |
| 9,530,781 B2 | 12/2016 | Miyamoto et al. |
| 9,570,462 B2 | 2/2017 | Lee et al. |
| 9,576,971 B2 | 2/2017 | Zhang et al. |
| 9,905,568 B2 | 2/2018 | Son et al. |
| 9,929,043 B2 | 3/2018 | Ito et al. |
| 9,985,098 B2 | 5/2018 | Matsumoto et al. |

(Continued)

*Primary Examiner* — Nikolay K Yushin
(74) *Attorney, Agent, or Firm* — Myers Bigel, P.A.

(57) ABSTRACT

A vertical memory device may include a channel connecting pattern on a substrate, gate electrodes spaced apart from each other in a first direction on the channel connecting pattern, and a channel extending in the first direction through the gate electrodes and the channel connecting pattern. Each of the electrodes may extend in a second direction substantially parallel to an upper surface of the substrate, and the first direction may be substantially perpendicular to the upper surface of the substrate. An end portion of the channel connecting pattern in a third direction substantially parallel to the upper surface of the substrate and substantially perpendicular to the second direction may have an upper surface higher than an upper surface of other portions of the channel connecting pattern except for a portion thereof adjacent the channel.

20 Claims, 39 Drawing Sheets

(56) References Cited

U.S. PATENT DOCUMENTS

| | | |
|---|---|---|
| 9,997,538 B2 | 6/2018 | Son et al. |
| 2018/0102254 A1 | 4/2018 | Kim et al. |
| 2018/0138195 A1 | 5/2018 | Lee |

A            A'

1ST DIRECTION

3RD DIRECTION

2ND DIRECTION

VERTICAL MEMORY DEVICES

CROSS-REFERENCE TO RELATED APPLICATIONS

This application is a continuation of U.S. patent application Ser. No. 16/516,756, filed Jul. 19, 2019, now allowed, which claims priority under 35 USC § 119 to Korean Patent Application No. 10-2018-0152388, filed Nov. 30, 2018 in the Korean Intellectual Property Office (KIPO), the contents of which are herein incorporated by reference in their entireties.

BACKGROUND

1. Field

The inventive concepts relate generally to vertical memory devices and, more particularly, to VNAND flash memory devices.

2. Description of the Related Art

During fabrication of a VNAND flash memory device, a sacrificial layer may be formed between a substrate and a mold, channels may be formed through the mold and the sacrificial layer, openings may be formed through the mold and the sacrificial layer, the sacrificial layer exposed by the openings may be removed to form gaps, and the gaps may be filled with polysilicon layers so that the channels may be connected with each other. If the polysilicon layers do not completely fill the gaps, voids may be generated in the polysilicon layers.

SUMMARY

Example embodiments provide a vertical memory device having improved characteristics.

According to an aspect of the inventive concept, there is provided a vertical memory device. The vertical memory device may include a channel connecting pattern on a substrate, gate electrodes spaced apart from each other in a first direction on the channel connecting pattern, and a channel extending in the first direction through the gate electrodes and the channel connecting pattern. Each of the electrodes may extend in a second direction substantially parallel to an upper surface of the substrate, and the first direction may be substantially perpendicular to the upper surface of the substrate. An end portion of the channel connecting pattern in a third direction substantially parallel to the upper surface of the substrate and substantially perpendicular to the second direction may have an upper surface higher than an upper surface of other portions of the channel connecting pattern except for a portion thereof adjacent the channel.

According to an aspect of the inventive concept, there is provided a vertical memory device. The vertical memory device may include a channel connecting pattern on a substrate, gate electrodes spaced apart from each other in a first direction on the channel connecting pattern, a channel extending in the first direction through the gate electrodes and the channel connecting pattern. Each of the electrodes may extend in a second direction substantially parallel to an upper surface of the substrate, and the first direction may be substantially perpendicular to the upper surface of the substrate. An end portion of the channel connecting pattern in a third direction substantially parallel to the upper surface of the substrate and substantially perpendicular to the second direction may have a thickness in the first direction greater than a thickness in the first direction of other portions of the channel connecting pattern except for a portion thereof adjacent the channel.

According to an aspect of the inventive concept, there is provided a vertical memory device. The vertical memory device may include channels on a substrate, a channel connecting pattern on the substrate, gate electrodes, and a common source line (CSL). Each of the channels may extend in a first direction substantially perpendicular to an upper surface of the substrate. The channel connecting pattern may contact outer sidewalls of the channels to connect the channels with each other. The gate electrodes may be spaced apart from each other in the first direction on the channel connecting pattern, and each of the electrodes may extend in a second direction substantially parallel to an upper surface of the substrate to surround the channels. The CSL may extend in the second direction on the substrate, and may divide each of the gate electrodes and the channel connecting pattern in a third direction perpendicular to the second direction and substantially parallel to the upper surface of the substrate. An end portion of the channel connecting pattern adjacent to the CSL may include an upper surface having a slope of which an absolute value increases with increasing distance from the CSL.

According to an aspect of the inventive concept, there is provided a vertical memory device. The vertical memory device may include a channel connecting pattern on a substrate, gate electrodes spaced apart from each other in a first direction on the channel connecting pattern, and a channel extending in the first direction through the gate electrodes and the channel connecting pattern. Each of the electrodes may extend in a second direction substantially parallel to an upper surface of the substrate, and the first direction may be substantially perpendicular to the upper surface of the substrate. A height in the first direction of an upper surface of a middle portion of the channel connecting pattern is lower than heights in the first direction of upper surfaces of end portions of the channel connecting pattern adjacent to the channel and opposite the channel, respectively, in a cross-sectional view of the vertical memory device.

In the vertical memory device in accordance with example embodiments, the channel connecting pattern for connecting the channels may include an air gap therein; however, the air gap may not be formed in the area adjacent to the CSL, and, thus, the metal of the gate electrode may not infiltrate into the air gap so as to reduce the risk of degrading the characteristics of the vertical memory device.

DETAILED DESCRIPTION

Figure 1:
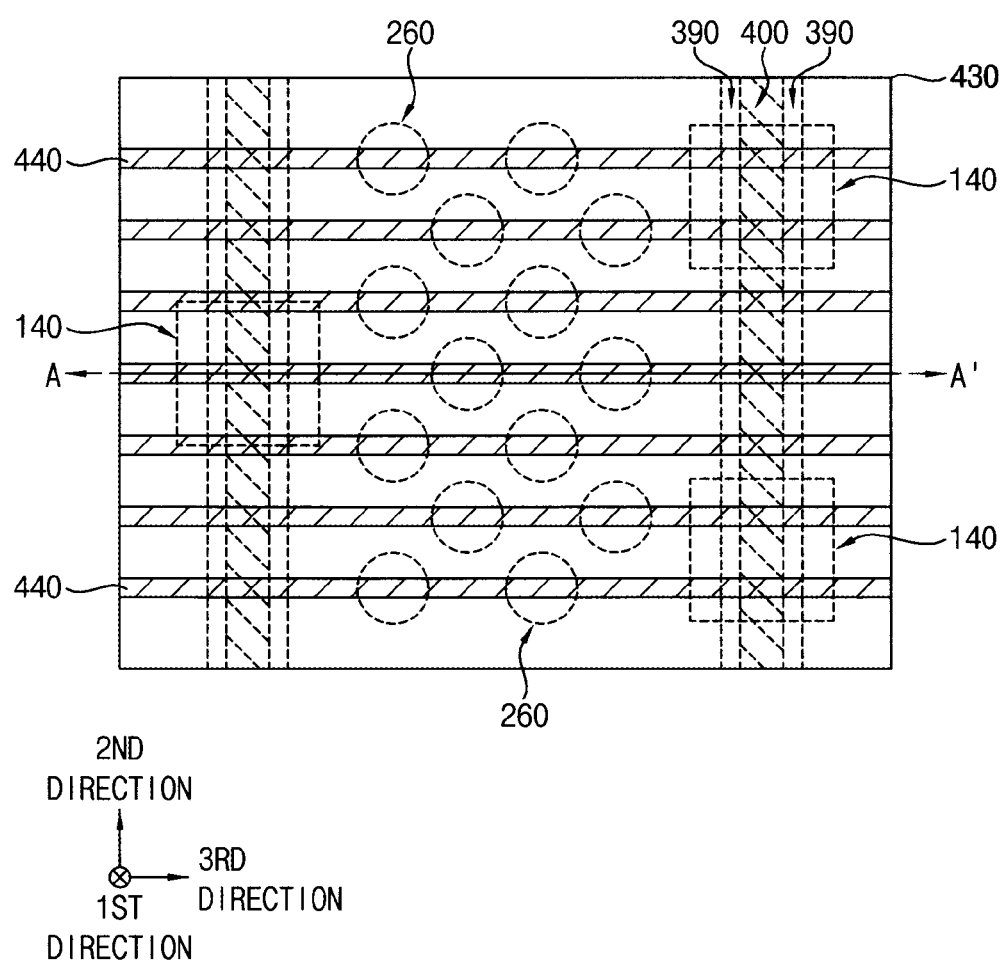
FIGS. 1 to 3 are a plan view and cross-sectional views illustrating a vertical memory device in accordance with example embodiments of the inventive concept.

The above and other aspects and features of the vertical memory devices and the methods of manufacturing the same in accordance with example embodiments will become readily understood from detailed description that follows, with reference to the accompanying drawings. Hereinafter, a direction substantially perpendicular to an upper surface of a substrate may be defined as a first direction, and two directions substantially parallel to the upper surface of the substrate and crossing each other may be defined as second and third directions, respectively. In example embodiments, the second and third directions may be substantially perpendicular to each other. Like reference numerals may refer to like elements throughout this description. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
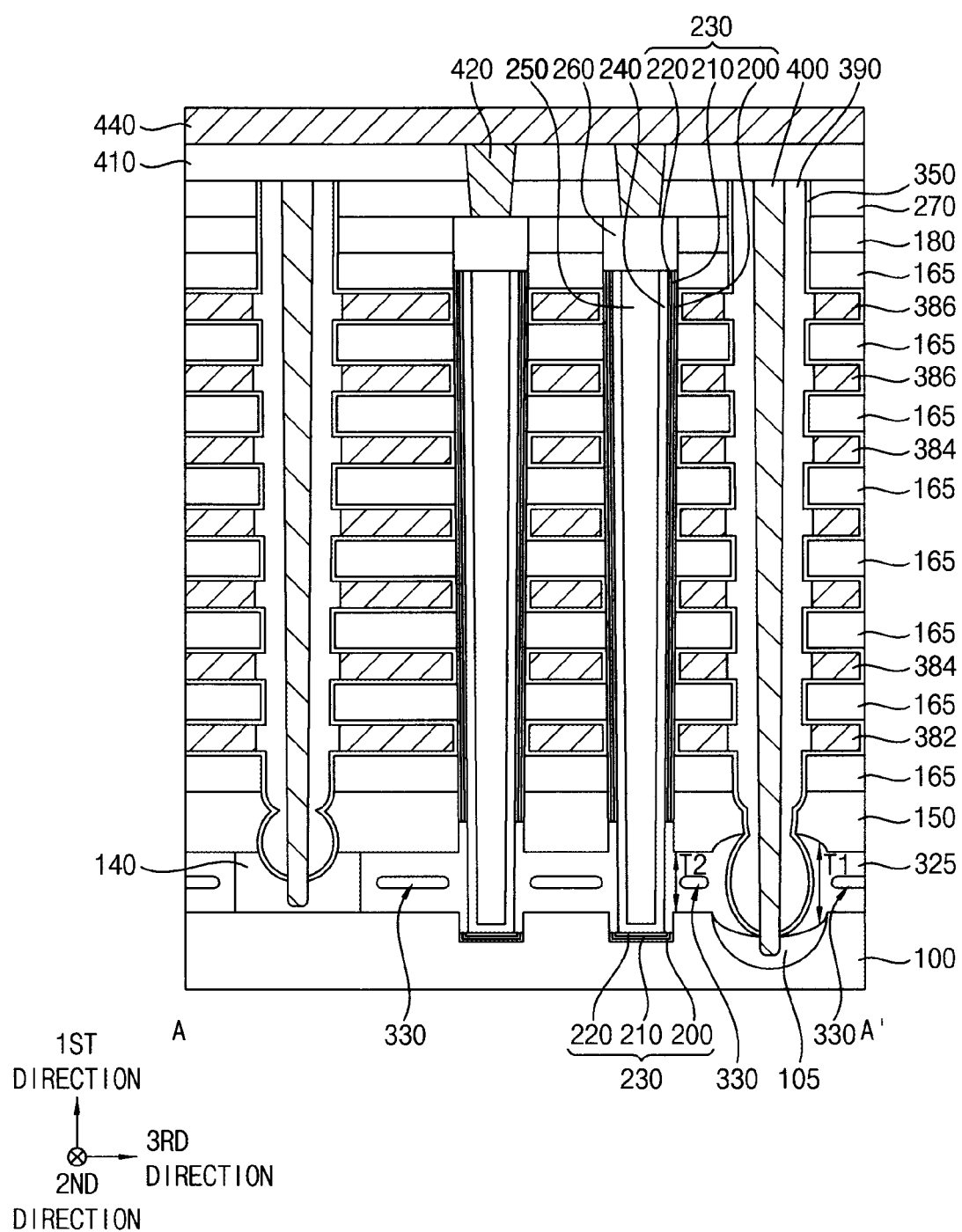
Figure 3:
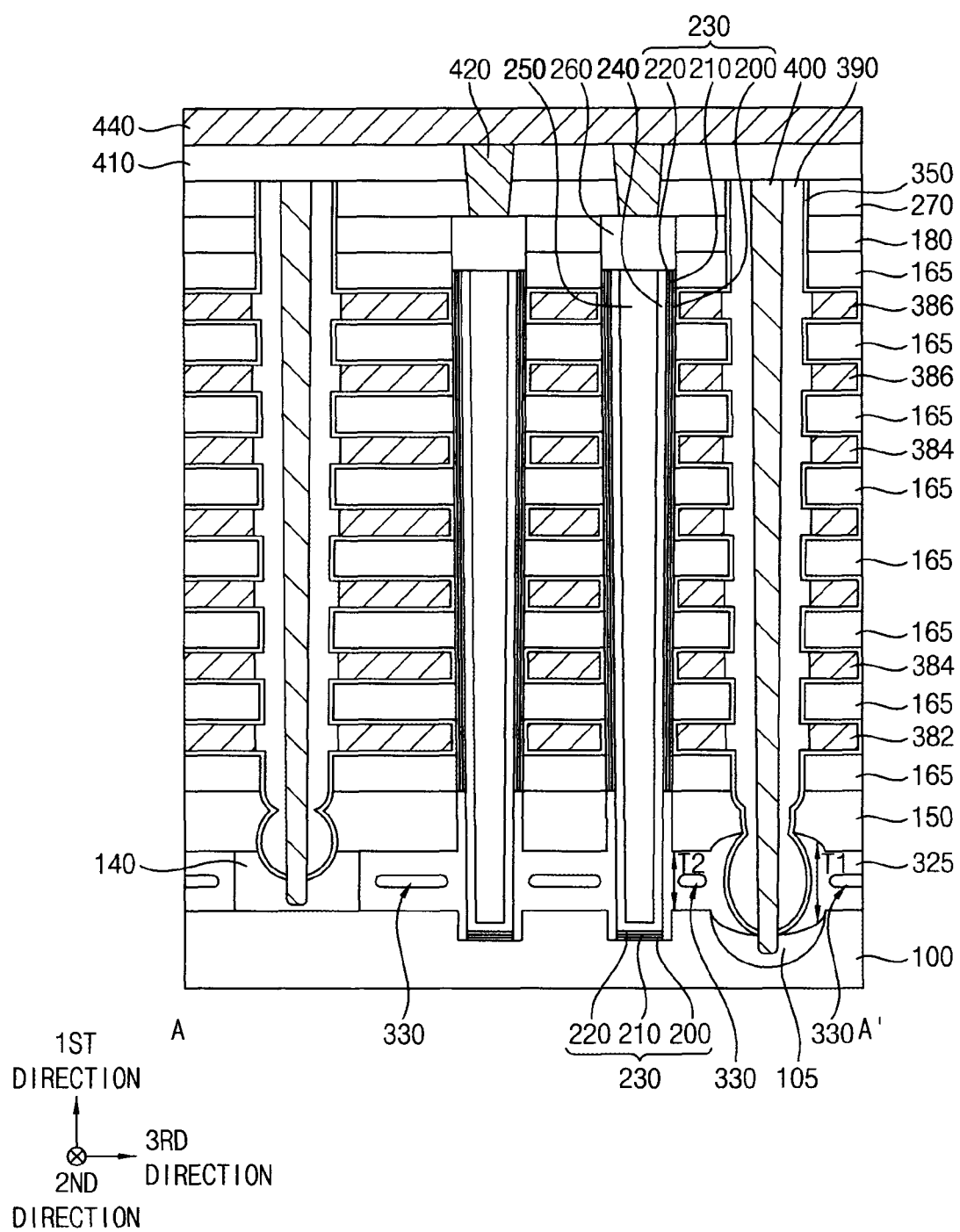

FIGS. 1 to 3 are a plan view and cross-sectional views illustrating a vertical memory device in accordance with example embodiments of the inventive concept. FIGS. 2 and 3 are cross-sectional views taken along a line A-A' of FIG. 1.

Referring to FIGS. 1 and 2, the vertical memory device may include a channel connecting pattern 325 on a substrate 100, gate electrodes spaced apart from each other in the first direction on the channel connecting pattern 325 and extending in the second direction, a channel 240 extending through the gate electrodes and the channel connecting pattern 325 in the first direction on the substrate 100, and a common source line (CSL) 400 extending in the second direction to divide each of the gate electrodes and the channel connecting pattern 325 in the third direction.

The vertical memory device may further include an impurity region 105 at an upper portion of the substrate 100, a support pattern 140 contacting a sidewall of the channel connecting pattern 325 on the substrate 100, a support layer 150 between the channel connecting pattern 325 and the support pattern 140 and a lowermost one of the gate electrodes, an insulation pattern 165 between the gate electrodes, a charge storage structure 230 at least partially covering an outer sidewall and a bottom of the channel 240, a filling pattern 250 that partially or fully fills a space defined by the channel 240, a capping pattern 260 on the channel 240, the filling pattern 250 and the charge storage structure 230, a second spacer 390 at least partially covering a sidewall of the CSL 400, a second blocking pattern 350 at least partially covering upper and lower surfaces and portions of sidewalls of the gate electrodes, first to fourth insulating interlayers 180, 270, 410 and 430 sequentially stacked on the gate electrodes, a contact plug 420 extending through the second and third insulating interlayers 270 and 410 to contact an upper surface of the capping pattern 260, and a bit line 440 extending through the fourth insulating interlayer 430 to contact the contact plug 420.

The substrate 100 may include silicon, germanium, silicon-germanium or a III-V compound, such as GaP, GaAs, GaSb, etc. In some embodiments, the substrate 100 may be a silicon-on-insulator (SOI) substrate or a germanium-on-insulator (GOI) substrate.

A plurality of channel connecting patterns 325, which extend in the second direction and are divided in the third direction by the CSL 400, and the second spacer 390 at least partially covering each of opposite sidewalls of the CSL 400 in the third direction may be formed on the substrate 100.

In example embodiments, a first thickness T1 in the first direction of an end portion of the channel connecting pattern 325, that is, of a portion of the channel connecting pattern 325 adjacent the CSL 400 may be greater than a second thickness T2 in the first direction of other portions thereof farther away from the CSL 400. In example embodiments, an upper surface of the end portion of the channel connecting pattern 325 adjacent the CSL 400 may be higher than upper surfaces of other portions thereof more distant from the CSL 400 in the cross-sectional view of FIG. 2, except for an upper surface of a portion thereof immediately adjacent the channel 240. In other words, the upper surface of the end portions of the channel connecting pattern 325 adjacent to the CSL 400 and the channel 240 are higher than the middle portion of the channel connecting pattern 325. Additionally, a lower surface of the end portion of the channel connecting pattern 325 may be lower than lower surfaces of other portions thereof in the cross-sectional view of FIG. 2, except for a lower surface of the portion thereof adjacent the channel 240. The other portions of the channel connecting pattern 325 except for the portion thereof adjacent the channel 240 may have generally flat upper and lower surfaces that may be substantially parallel to an upper surface of the substrate 100.

In example embodiments, the end portion of the channel connecting pattern 325 may be symmetric with respect to a horizontal line extending through a center thereof in the third direction as shown in FIG. 2.

In example embodiments, a slope of an upper surface of the end portion of the channel connecting pattern 325 as shown in FIG. 2 may have an absolute value gradually increasing with distance away from the CSL 400 until reaching a portion of the end portion of the channel connecting pattern 325 having the thickness T2. A slope of a lower surface of the end portion of the channel connecting pattern 325 may also have an absolute value gradually increasing with distance away from the CSL 400 until reaching a portion of the end portion of the channel connecting pattern 325 having the thickness T2.

The channel connecting pattern 325 may contact outer sidewalls of a plurality of channels 240 so as to connect the plurality of channels 240 with each other. The portion of the channel connecting pattern 325 adjacent the channel 240 may protrude upwardly and downwardly in the first direction when compared to neighboring portions of the channel connecting pattern 325. Thus, an upper surface of the portion of the channel connecting pattern 325 adjacent the channel 240 may be higher than a lower surface of the support layer 150 in the cross-sectional view of FIG. 2, and a lower surface of the portion of the channel connecting pattern 325 adjacent the channel 240 may be lower than an upper surface of the substrate 100 in the cross-sectional view of FIG. 2.

Referring to FIG. 3, the upper surface of the portion of the channel connecting pattern 325 adjacent the channel 240 may be substantially coplanar with an upper surface of the support layer 150, and the lower surface of the portion of the channel connecting pattern 325 adjacent the channel 240 may be substantially coplanar with a lower surface of the charge storage structure 230 at least partially covering the bottom of the channel 240.

The channel connecting pattern 325 may include, e.g., doped polysilicon.

In example embodiments, the channel connecting pattern 325 may include an air gap therein. However, in some embodiments, the air gap 330 may not be formed in a portion of the channel connecting pattern 325 adjacent the CSL 400, e.g., in the end portion thereof, and may be formed only in a portion thereof more distant from the CSL 400.

The support pattern 140 may be formed at a level in the first direction substantially equal to that of the channel connecting pattern 325, and thus a sidewall of the support pattern 140 may contact a sidewall of the channel connecting pattern 325. The support pattern 140 may include, e.g., doped polysilicon.

The support layer 150 may be formed on the channel connecting pattern 325 and the support pattern 140, and may include, e.g., doped polysilicon. A lower surface of the support layer 150 contacting the upper surface of the channel connecting pattern 325 having a non-uniform height may also have a non-uniform height, however, an upper surface of the support layer 150 may have a generally uniform height.

The gate electrodes 382, 384, 386 may be stacked at a plurality of levels, respectively, and may be spaced apart from each other in the first direction. The gate electrodes 382, 384, 386 at the respective plurality of levels may form a gate electrode structure. The insulation pattern 165 may be formed between neighboring ones of the gate electrodes 382, 384, 386 at the respective levels so that the neighboring gate electrodes may be insulated from each other. The insulation pattern 165 may include an oxide, e.g., silicon oxide.

The gate electrode structure may include at least one first gate electrode 382, a plurality of second gate electrodes 384, and at least one third gate electrode 386 sequentially stacked in the first direction. A plurality of gate electrode structures may be formed to be spaced apart from each other in the third direction by the CSL 400 extending in the second direction.

Each of the gate electrodes 382, 384, 386 may include a gate conductive pattern and a gate barrier pattern at least partially covering a surface of the gate conductive pattern. The gate conductive pattern may include a low resistance metal, e.g., tungsten, titanium, tantalum, platinum, etc., and the gate barrier pattern may include a metal nitride, e.g., titanium nitride, tantalum nitride, etc.

The channel 240 may have, e.g., a cup-like shape, an outer sidewall of the channel 240 may be covered by the charge storage structure 230, and an inner space defined by the channel 240 may be entirely or partially filled with the filling pattern 250. The channel 240 may include, e.g., undoped polysilicon, and the filling pattern 250 may include an oxide, e.g., silicon oxide.

In example embodiments, a plurality of channels 240 may be formed in each of the second and third directions, which may form a channel array. Ones of the channels 240 surrounded by one gate electrode structure between neighboring ones of the CSLs 400 in the third direction may be connected with each other by the channel connecting pattern 325.

The charge storage structure 230 may at least partially cover most of the outer sidewall of the channel 240, and may include an upper portion extending through the gate electrodes and a lower portion at least partially covering the bottom of the channel 240 on the substrate 100. That is, the upper and lower portions of the charge storage structure 230 may be spaced apart from each other in the first direction by a portion of the channel connecting pattern 325 contacting a lower outer sidewall of the channel 240. A lower surface of the upper portion of the charge storage structure 230 and an upper surface of the lower portion of the charge storage structure 230 may contact the channel connecting pattern 325 as shown in FIGS. 2 and 3.

The charge storage structure 230 may include a tunnel insulation pattern 220, a charge storage pattern 210, and a first blocking pattern 200 sequentially stacked in a horizontal direction, i.e., third direction, from the outer sidewall of the channel 240. In some embodiments, the tunnel insulation pattern 220, the charge storage pattern 210, and the first blocking pattern 200 may include an oxide, e.g., silicon oxide, a nitride, e.g., silicon nitride, and an oxide, e.g., silicon oxide, respectively.

The capping pattern 260 may be formed on the channel 240, the charge storage structure 230 and the filling pattern 250, and thus may be connected to the channel 240. The capping pattern 250 may include, e.g., doped polysilicon.

The CSL 400 may extend in the first direction on the substrate 100, and may also extend in the second direction. The CSL 400 may include a metal, e.g., tungsten, copper, aluminum, etc.

A sidewall of the CSL 400, which extends in the first direction, may be at least partially covered by the second spacer 390, which is adjacent thereto in the third direction. Thus, the CSL 400 may be electrically insulated from the gate electrodes. The second spacer 390 may include an oxide, e.g., silicon oxide.

The impurity region 105 may be formed at an upper portion of the substrate 100 contacting a lower surface of the CSL 400 as shown in FIGS. 2 and 3. The impurity region 105 may include, e.g., single crystalline silicon doped with n-type impurities. In example embodiments, the impurity region 105 may contact the lower surface of the channel connecting pattern 325, and, thus, currents generated by voltages applied from the CSL 400 may flow through the impurity region 105 and the channel connecting pattern 325.

The second blocking pattern 350 may at least partially cover upper and lower surfaces and a sidewall of each gate electrode, and may form a blocking pattern structure together with the first blocking pattern 200 of the charge storage structure 230. Thus, the tunnel insulation pattern 220, the charge storage pattern 210 and the blocking pattern structure may be formed between the channel 240 and each gate electrode 382, 384, 386.

The first to fourth insulating interlayers 180, 270, 410 and 430 may include an oxide, e.g., silicon oxide, and may be merged with each other.

The contact plug 420 may be formed on the capping pattern 260, and currents generated by voltages applied from the bit line 440 may flow through the contact plug 420 and the capping pattern 260.

The bit line 440 may extend through the fourth insulating interlayer 430, and a plurality of bit lines 440 may be formed in the second direction.

In the vertical memory device, the air gap 330 may be formed in the channel connecting pattern 325 for connecting the channels 240 with each other, and may be spaced apart from an area adjacent the CSL 400 and the second spacer 390. This may reduce the risk, for example, of a metal infiltrating into the air gap 330 during the fabrication process, which could degrade the characteristics of the vertical memory device. Methods of manufacturing a vertical memory device, in accordance with some embodiments of the inventive concept, will be described hereafter with reference to FIGS. 4 to 21.

FIGS. 4 to 21 are plan views and cross-sectional views illustrating a method of manufacturing a vertical memory device in accordance with example embodiments of the inventive concept. Particularly, FIGS. 4, 7 and 10 are the plan views, and FIGS. 5-6, 8-9 and 11-21 are cross-sectional views taken along lines A-A', respectively, of the corresponding plan views.

Figure 4:
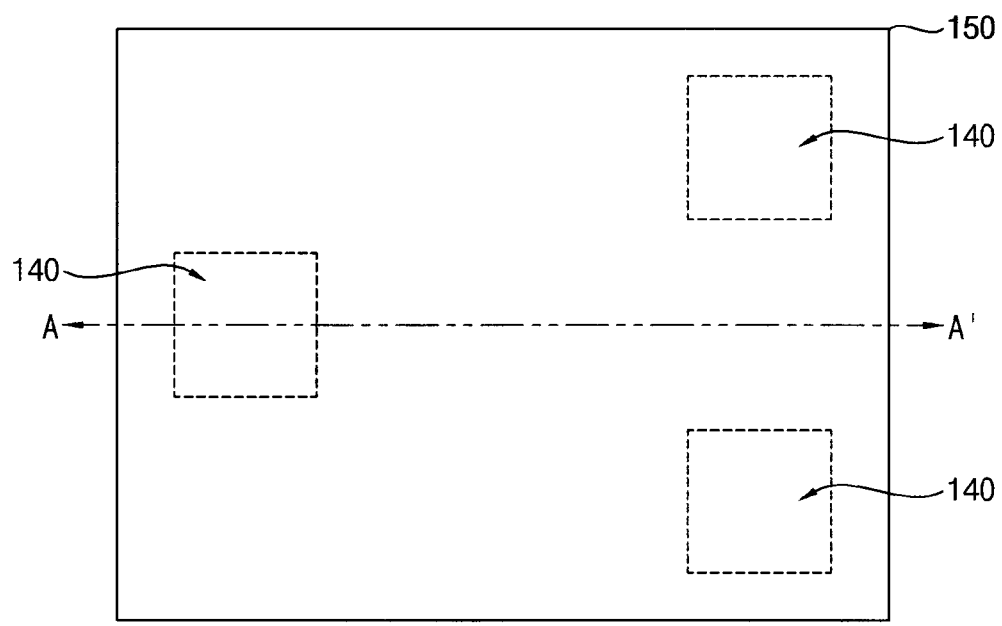
FIGS. 4 to 21 are plan views and cross-sectional views illustrating a method of manufacturing a vertical memory device in accordance with example embodiments of the inventive concept.
Figure 4:
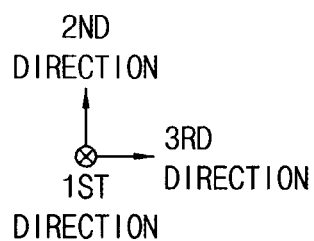
Figure 5:
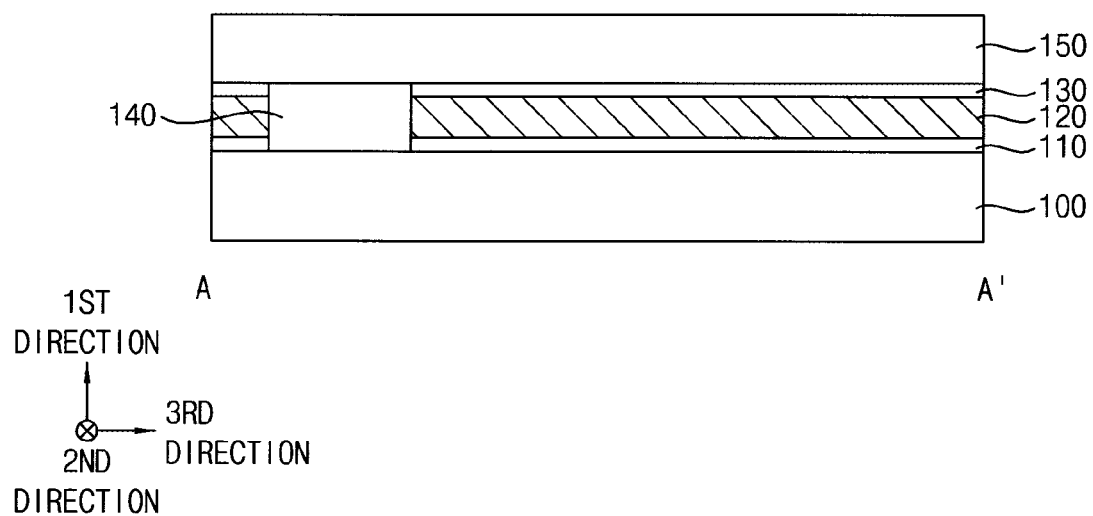

Referring to FIGS. 4 and 5, first, second and third sacrificial layers 110, 120 and 130 may be sequentially stacked on a substrate 100, the first to third sacrificial layers 110, 120 and 130 may be partially removed to form a support pattern 140 on the substrate 100, and a support layer 150 may be formed on the third sacrificial layer 130 and the support pattern 140.

The first and third sacrificial layers 110 and 130 may include an oxide, e.g., silicon oxide, and the second sacrificial layer 120 may include a nitride, e.g., silicon nitride.

The first to third sacrificial layers 110, 120 and 130 may be partially removed to form a first opening, and the first opening may be at least partially filled with the support pattern 140. Thus, the support pattern 140 may be formed at a level substantially equal to that of a structure including the first to third sacrificial layers 110, 120 and 130, i.e., so a top surface thereof is generally co-planar with a top surface of the third sacrificial layer in the cross-sectional view of FIG. 5, and a sidewall of the support pattern 140 may contact sidewalls of the first to third sacrificial layers 110, 120 and 130.

In example embodiments, the support pattern 140 and the support layer 150 may include a material having an etching selectivity with respect to the first to third sacrificial layers 110, 120 and 130, e.g., doped or undoped polysilicon. However, the support pattern 140 and the support layer 150 may be formed by depositing amorphous silicon and performing an annealing process so as to include polysilicon. In other embodiments, the support pattern 140 and the support layer 150 may be formed by depositing amorphous silicon that may be converted into polysilicon through crystallization caused by heat from the deposition processes of other layers.

The support pattern 140 may overlap an area at which a second opening 280 may be formed, which will be illustrated below with reference to FIGS. 10 and 11. The second opening 280 may extend in the second direction, and a plurality of second openings 280 may be formed in the third direction. Thus, one or a plurality of support patterns 140 may be formed in the second direction, and a plurality of support patterns 140 may be formed in the third direction.

Figure 6:
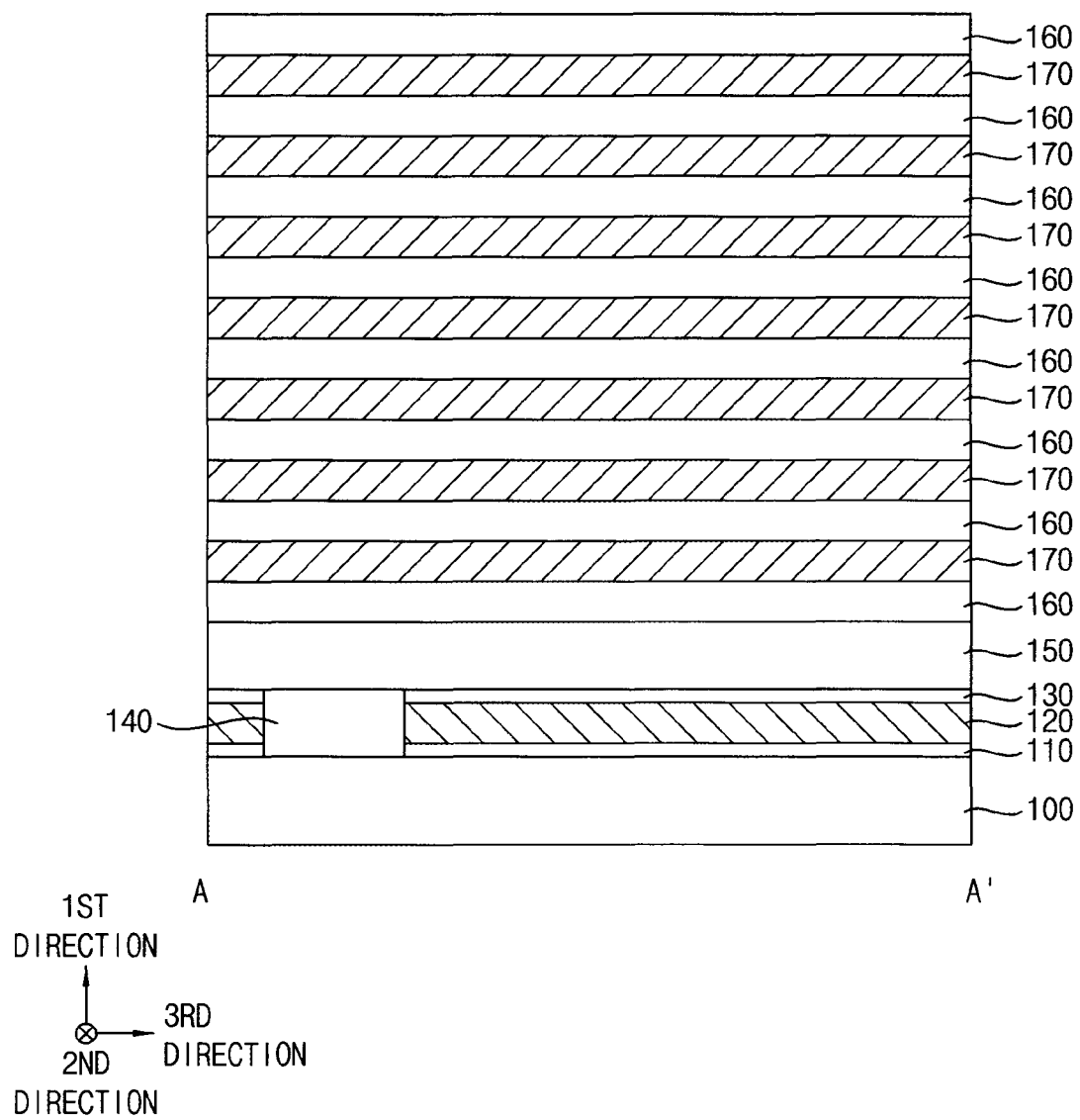
Figure 7:
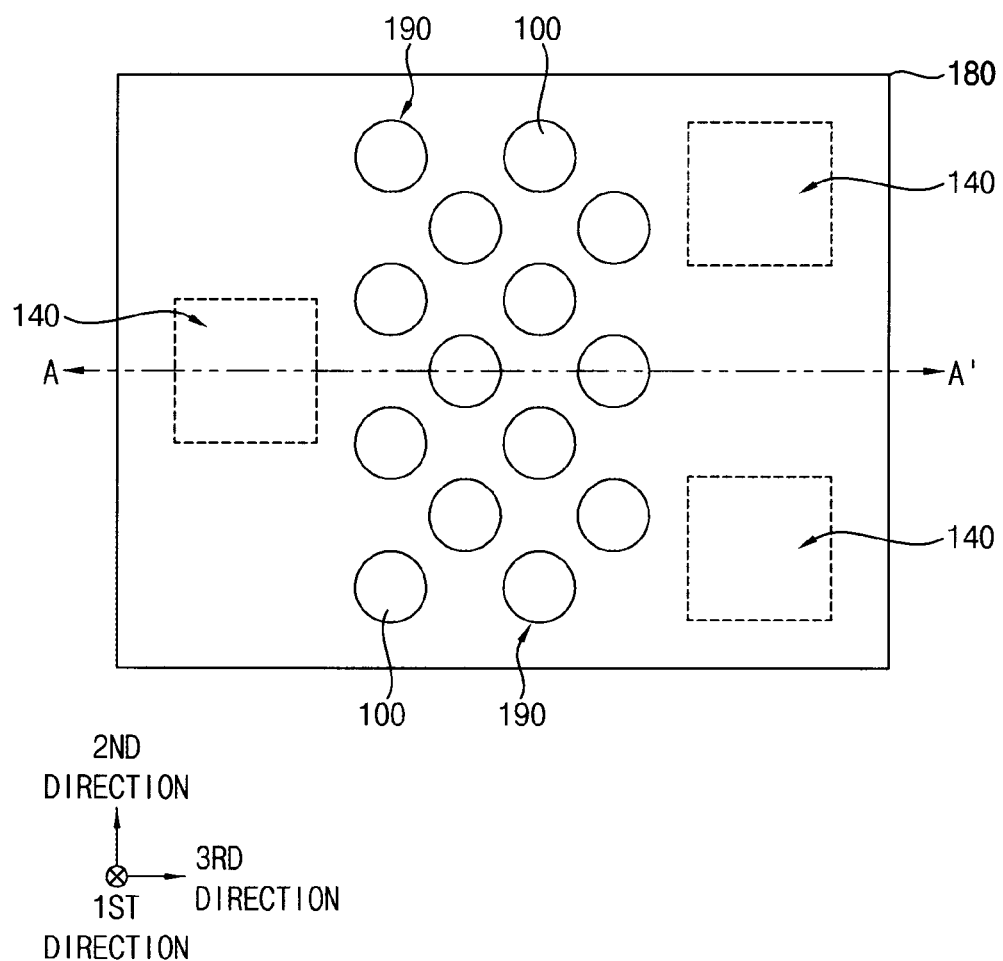

Referring to FIG. 6, an insulation layer 160 and a fourth sacrificial layer 170 may be alternately and repeatedly formed in the first direction (i.e., a vertical direction in the cross-sectional view of FIG. 6) on the support layer 150 to form a mold.

In example embodiments, the insulation layer 160 may include an oxide, e.g., silicon oxide, and the fourth sacrificial layer 170 may include a material having an etching selectivity with respect to the insulation layer 160, e.g., a nitride such as silicon nitride.

The insulation layer 160 and the fourth sacrificial layer 170 may be formed by, e.g., a chemical vapor deposition (CVD) process, a plasma enhanced chemical vapor deposition (PECVD) process, an atomic layer deposition (ALD) process, etc.

Figure 8:
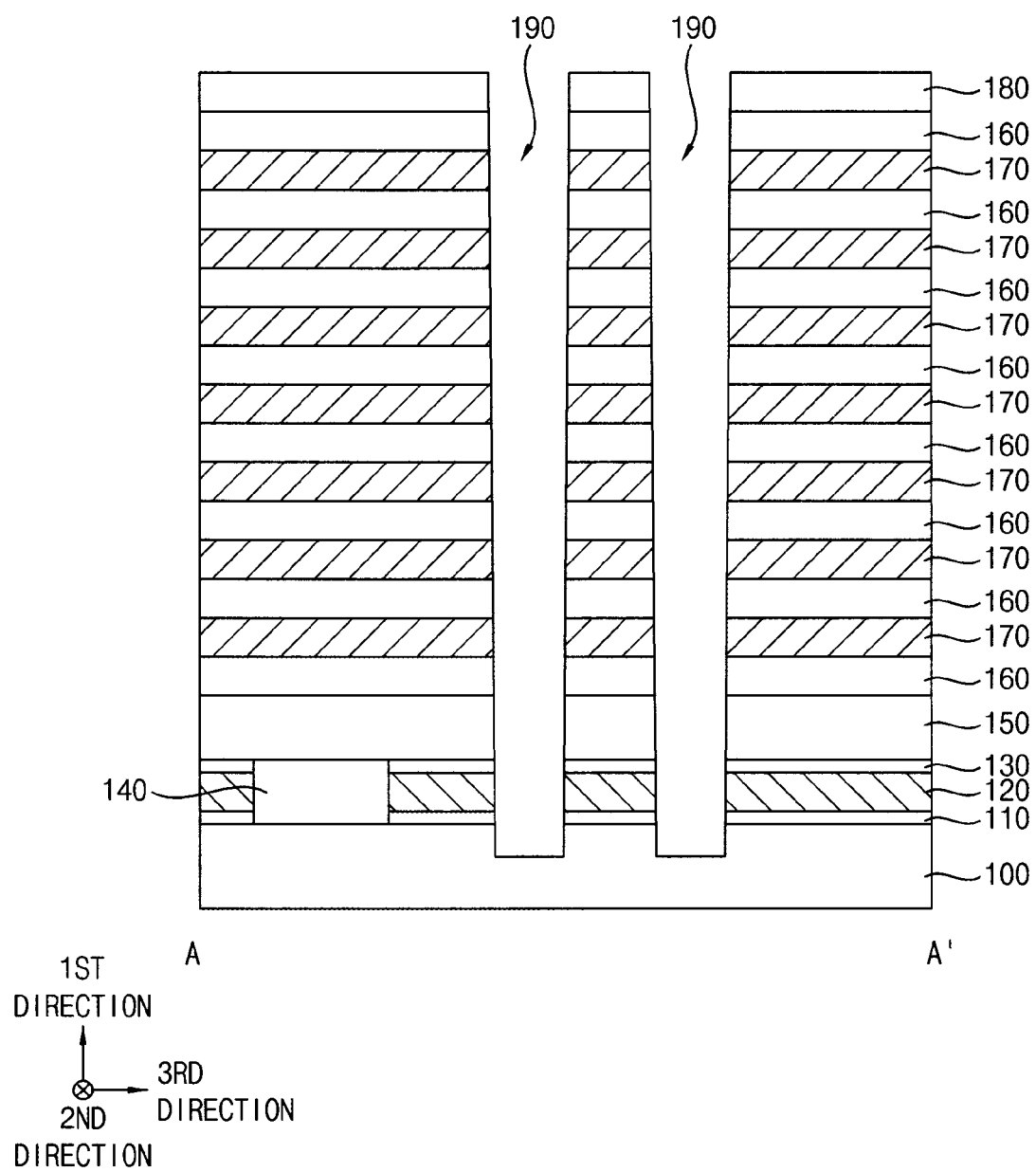

Referring to FIGS. 7 and 8, a first insulating interlayer 180 may be formed on an uppermost one of the insulation layers 160 in the cross-sectional view of FIG. 8, and a channel hole 190 may be formed through the first insulating interlayer 180, the mold, the support layer 150, and the first to third sacrificial layers 110, 120 and 130 by, for example, a dry etching process.

The first insulating interlayer 180 may include an oxide, e.g., silicon oxide.

In example embodiments, the dry etching process may be performed until an upper surface of the substrate 100 may be exposed, and an upper portion of the substrate 100 may be further removed in the dry etching process as shown in FIG. 8.

In example embodiments, a plurality of channel holes 190 may be formed in each of the second and third directions as shown in FIG. 7, and, thus, a channel hole array may be defined.

Figure 9:
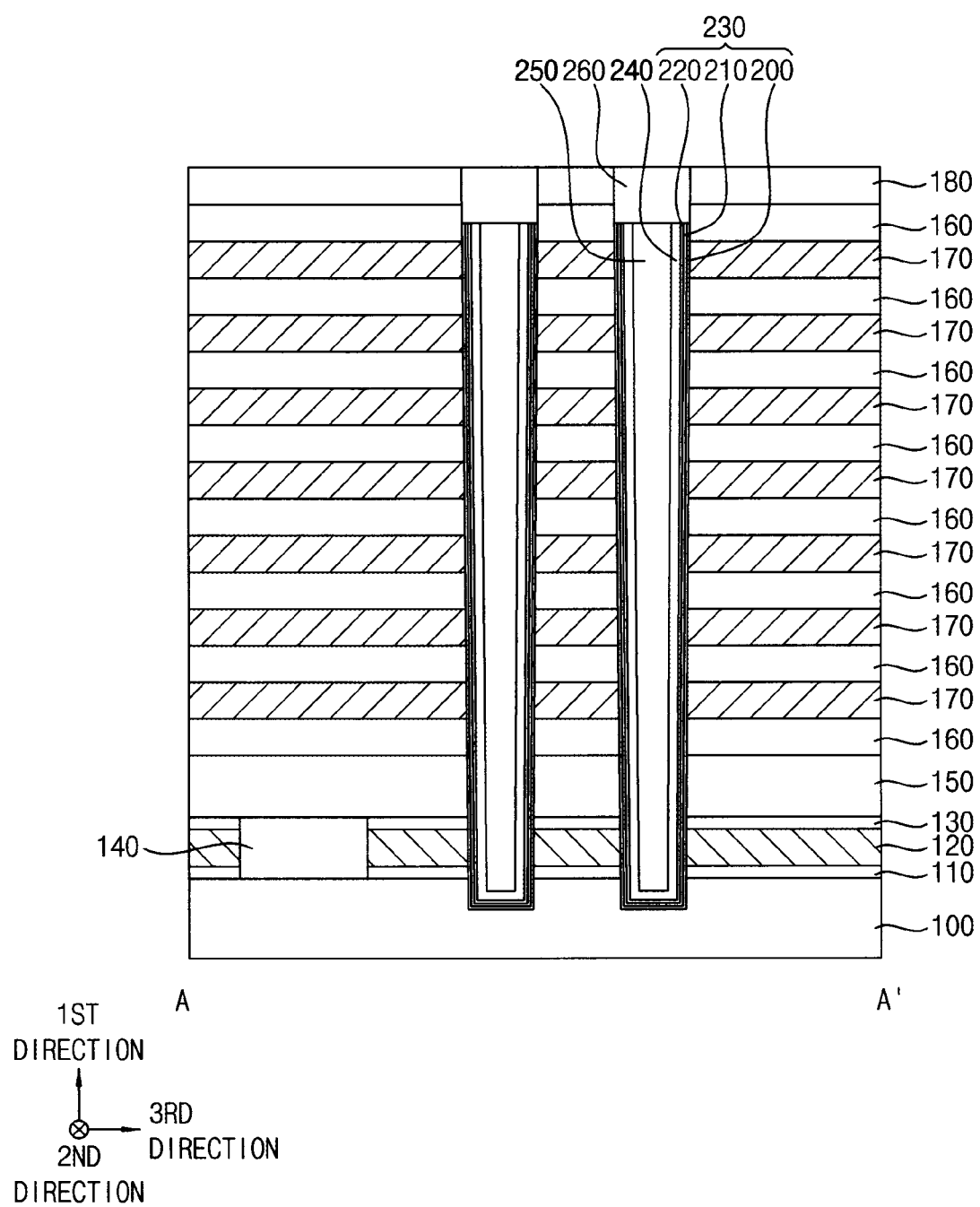
Figure 10:
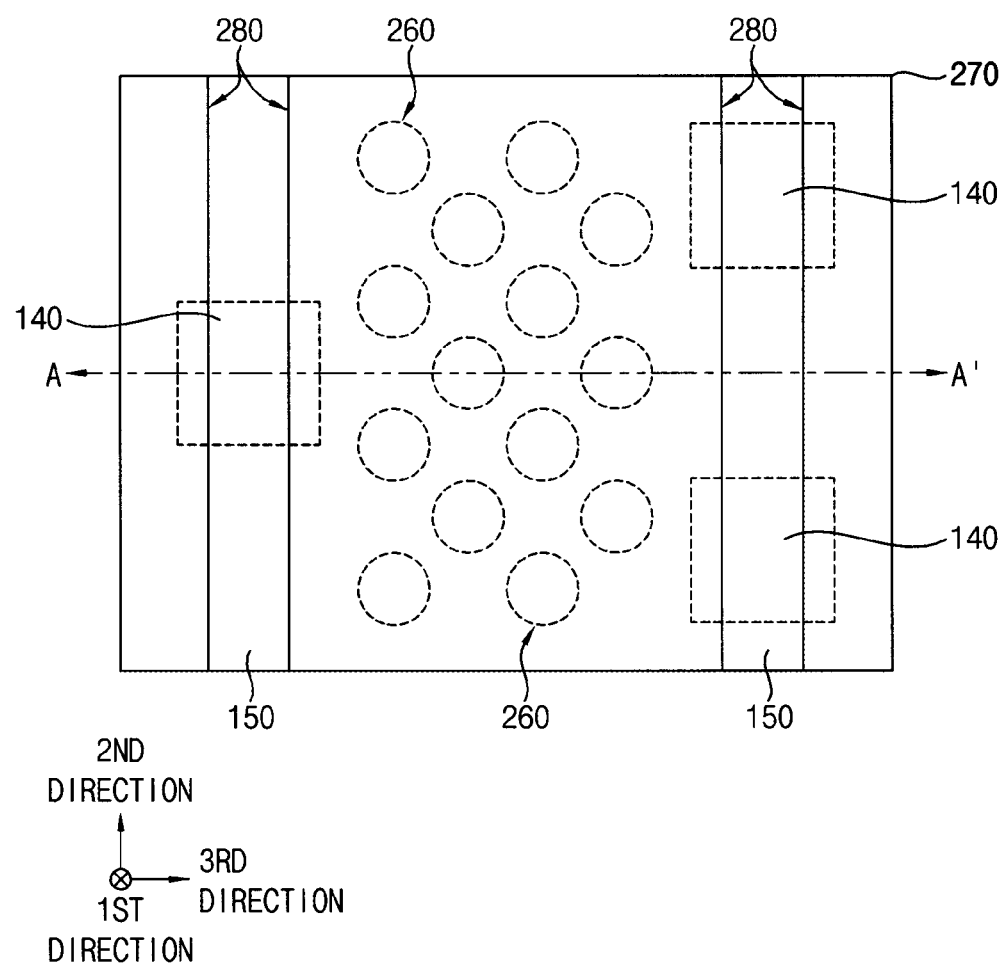

Referring to FIG. 9, a charge storage structure 230, a channel 240, a filling pattern 250 and a capping pattern 260 may be formed in the channel hole 190.

Particularly, a charge storage structure layer and a channel layer may be sequentially formed on a sidewall of the channel hole 190, the exposed upper surface of the substrate 100 and an upper surface of the first insulating interlayer 180, a filling layer may be formed on the channel layer to fill a remaining portion of the channel hole 190, and the filling layer, the channel layer and the charge storage structure layer may be planarized until the upper surface of the first insulating interlayer 180 may be exposed as shown in FIG. 9.

In example embodiments, the planarization process may include a chemical mechanical polishing (CMP) process and/or an etch back process.

By the planarization process, the charge storage structure 230 and the channel 240 each of which may have a cup-like shape and are sequentially stacked on the sidewall of the channel hole 190 and the upper surface of the substrate 100 may be formed, and the filling pattern 250 may at least partially fill an inner space formed by the channel 240.

As the channel hole 190 in which the channel 240 is formed may define the channel hole array, the channel 740 in the channel hole 190 may also define a channel array.

In example embodiments, the charge storage structure 230 may include a first blocking pattern 200, a charge storage pattern 210 and a tunnel insulation pattern 220, which are sequentially stacked. For example, the first blocking pattern 200, the charge storage pattern 210 and the tunnel insulation pattern 220 may include an oxide, e.g., silicon oxide, a nitride, e.g., silicon nitride, and an oxide, e.g., silicon oxide, respectively.

The channel 240 may include, e.g., undoped polysilicon, and the filling pattern 250 may include an oxide, e.g., silicon oxide.

Upper portions of the filling pattern 250, the channel 240 and the charge storage structure 230 may be removed to form a recess, a capping layer may be formed on the first insulating interlayer 180 to fill the recess, and the capping layer may be planarized until the upper surface of the first insulating interlayer 180 may be exposed to form a capping pattern 260. The capping pattern 260 may include, e.g., doped polysilicon.

Figure 11:
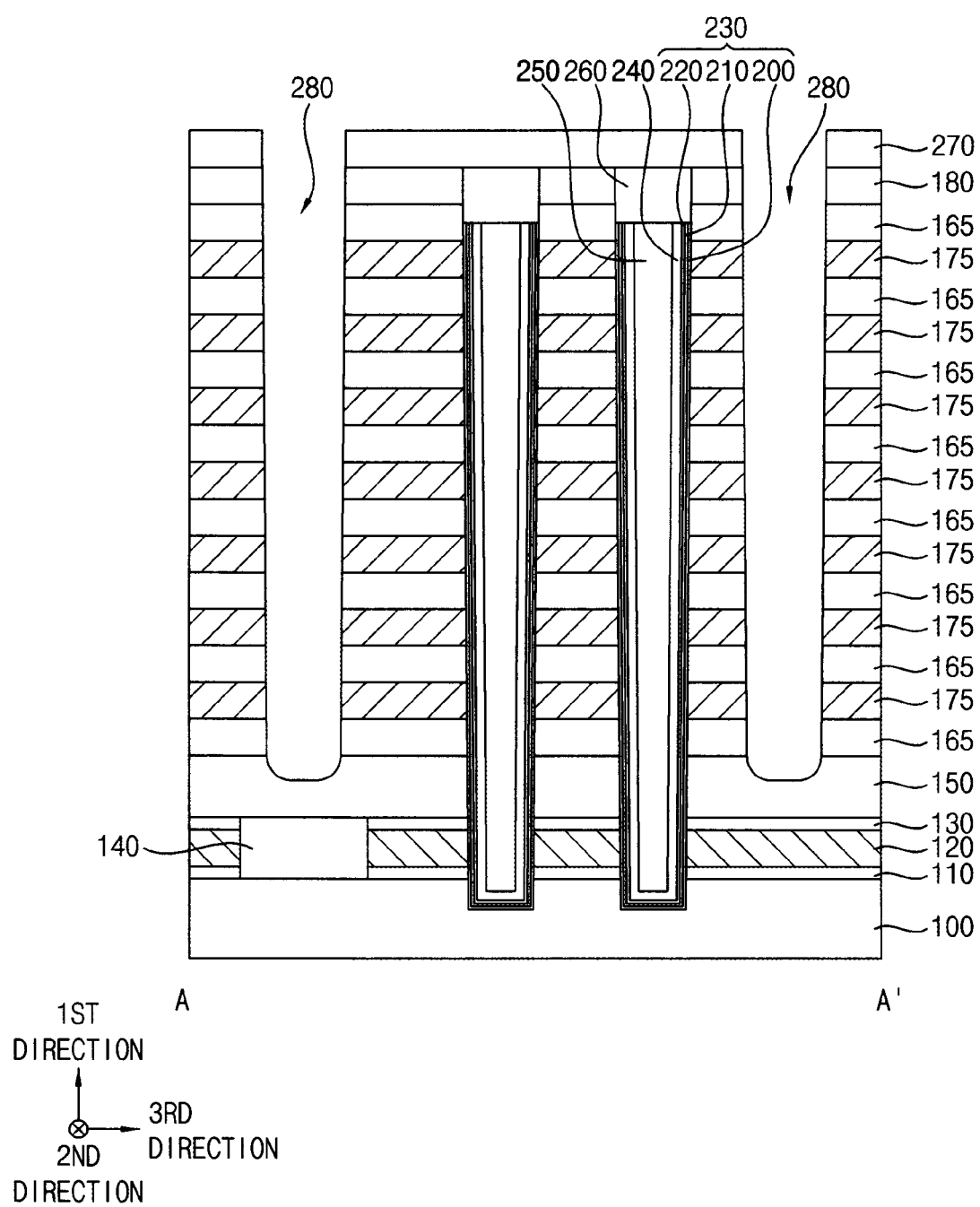

Referring to FIGS. 10 and 11, a second insulating interlayer 270 may be formed on the first insulating interlayer 180 and the capping pattern 260, and the second opening 280 may be formed through the first and second insulating interlayers 180 and 270 and the mold by, for example, a dry etching process.

In example embodiments, the dry etching process may be performed until an upper surface of the support layer 150 may be exposed, and an upper portion of the support layer 150 may be also removed during the dry etching process as shown in FIG. 11. As the second opening 280 is formed, the insulation layer 160 and the fourth sacrificial layer 170 of the mold may be exposed.

In example embodiments, the second opening 280 may extend in the second direction, and a plurality of second openings 280 may be formed in the third direction. As the second opening 280 is formed, the insulation layer 160 may be transformed into an insulation pattern 165 extending in the second direction, and the fourth sacrificial layer 170 may be transformed into a fourth sacrificial pattern 175 extending in the second direction.

Figure 12:
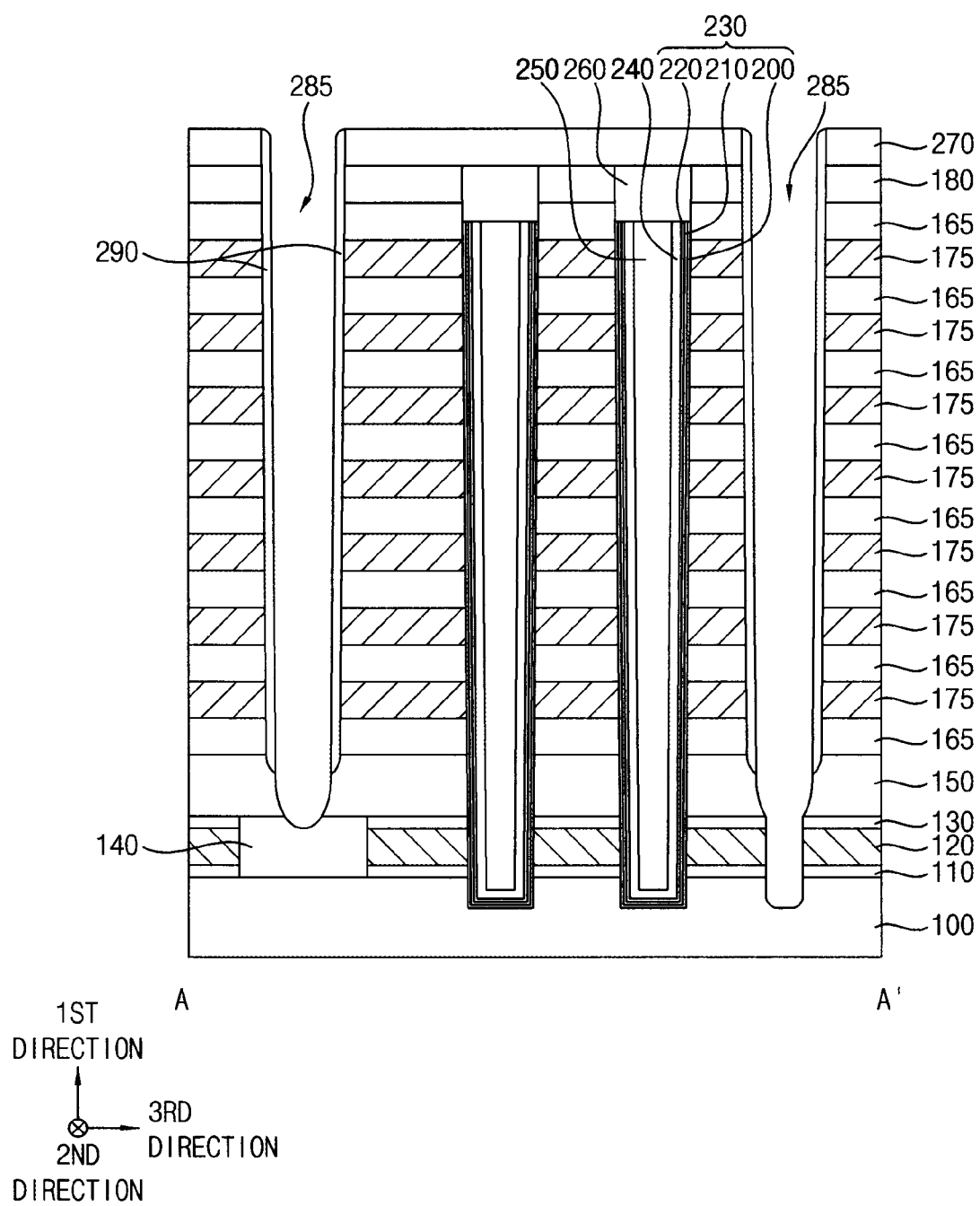

Referring to FIG. 12, a first spacer 290 may be formed on a sidewall of the second opening 280, and a portion of the support layer 150 exposed by the second opening 280 and the first to third sacrificial layers 110, 120 and 130 thereunder may be removed so that the second opening 280 may be enlarged downwardly to form a third opening 285, which may expose an upper surface of the substrate 100.

In example embodiments, the first spacer 290 may be formed by forming a first spacer layer to at least partially cover an inner wall of the second opening 280 and an upper surface of the second insulating interlayer 270, and anisotropically etching the first spacer layer. The first spacer 290 may include, e.g., undoped polysilicon.

The third opening 285 may expose the upper surface of the substrate 100, and further extend through an upper portion of the substrate 100 as illustrated by the third opening 285 on the right in FIG. 12. The third opening 285 may expose an upper surface of the support pattern 140, and further extend through an upper portion of the support pattern 140 as illustrated by the third opening 285 on the left in FIG. 12.

In example embodiments, the first spacer 290 may at least partially cover a sidewall of the second opening 280 when the third opening 285 is formed, and, thus, an enlarged area from the second opening 280, that is, a lower portion of the third opening 285 may have a width less than a width of the second opening 280, that is, a width of an upper portion of the third opening 285.

The first spacer 290 may at least partially cover the sidewall of the second opening 280 when the first to third sacrificial layers 110, 120 and 130 are partially removed, and, thus, the insulation pattern 165 and the fourth sacrificial pattern 175 of the mold may not be removed.

Figure 13:
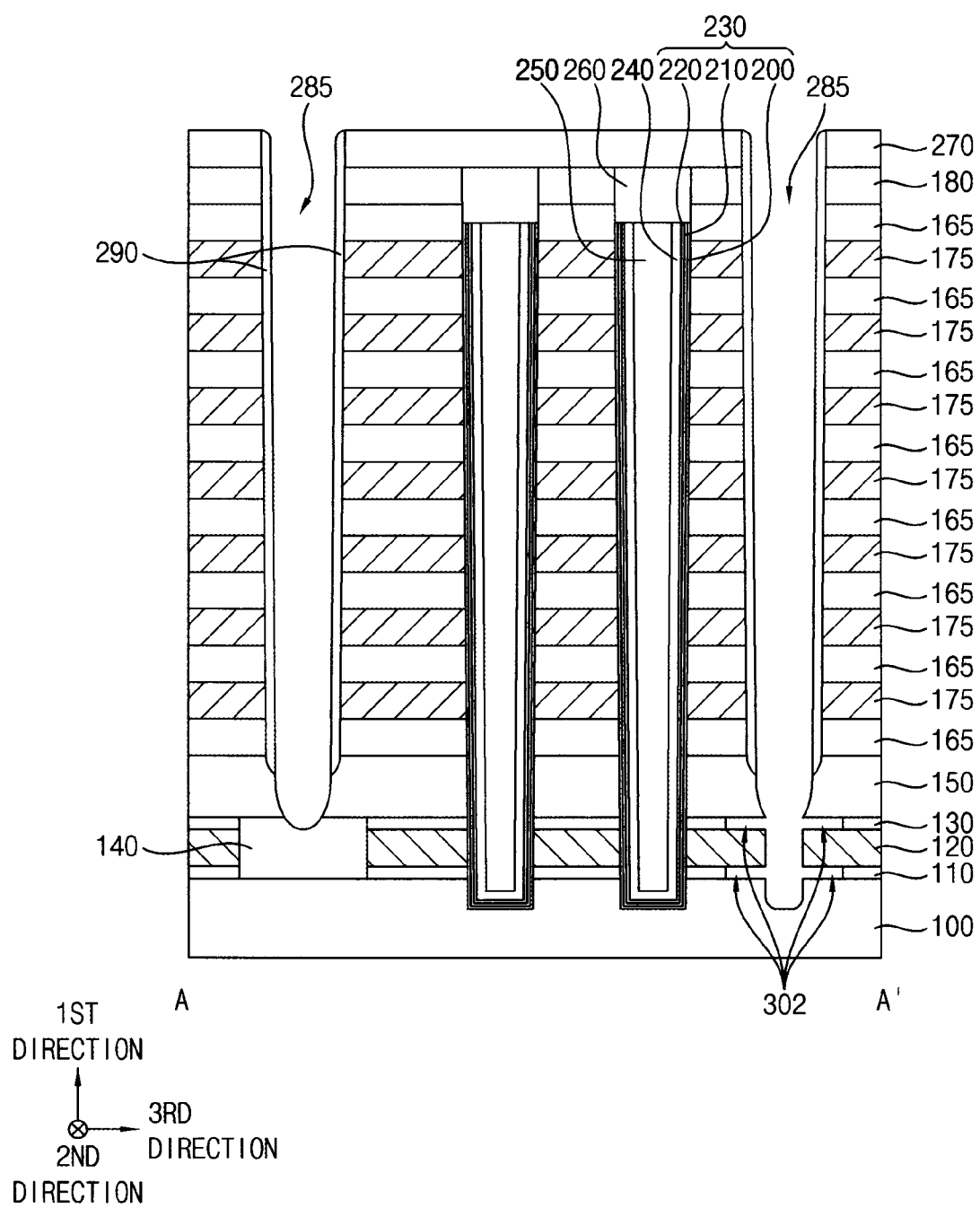

Referring to FIG. 13, the first and third sacrificial layers 110 and 130 exposed by the third opening 285 may be partially removed to form first gaps 302.

In example embodiments, the first gaps 302 may be formed by removing only portions of the first and third sacrificial layers 110 and 130 adjacent a sidewall of the third opening 285, and may be removed by a wet etching process using, hydrofluoric acid or by a dry etching process using, e.g., hydrogen fluoride.

As the first gaps 302 are formed, a lower portion of the support layer 150 and an upper portion of the substrate 100 adjacent the third opening 285 may be exposed as shown in FIG. 13. In other words, the first gaps 302 extend opposite one another in a plane defined by the third direction between the support layer 150 and the second sacrificial layer 120 and between the substrate 100 and the second sacrificial layer 120.

Figure 14:
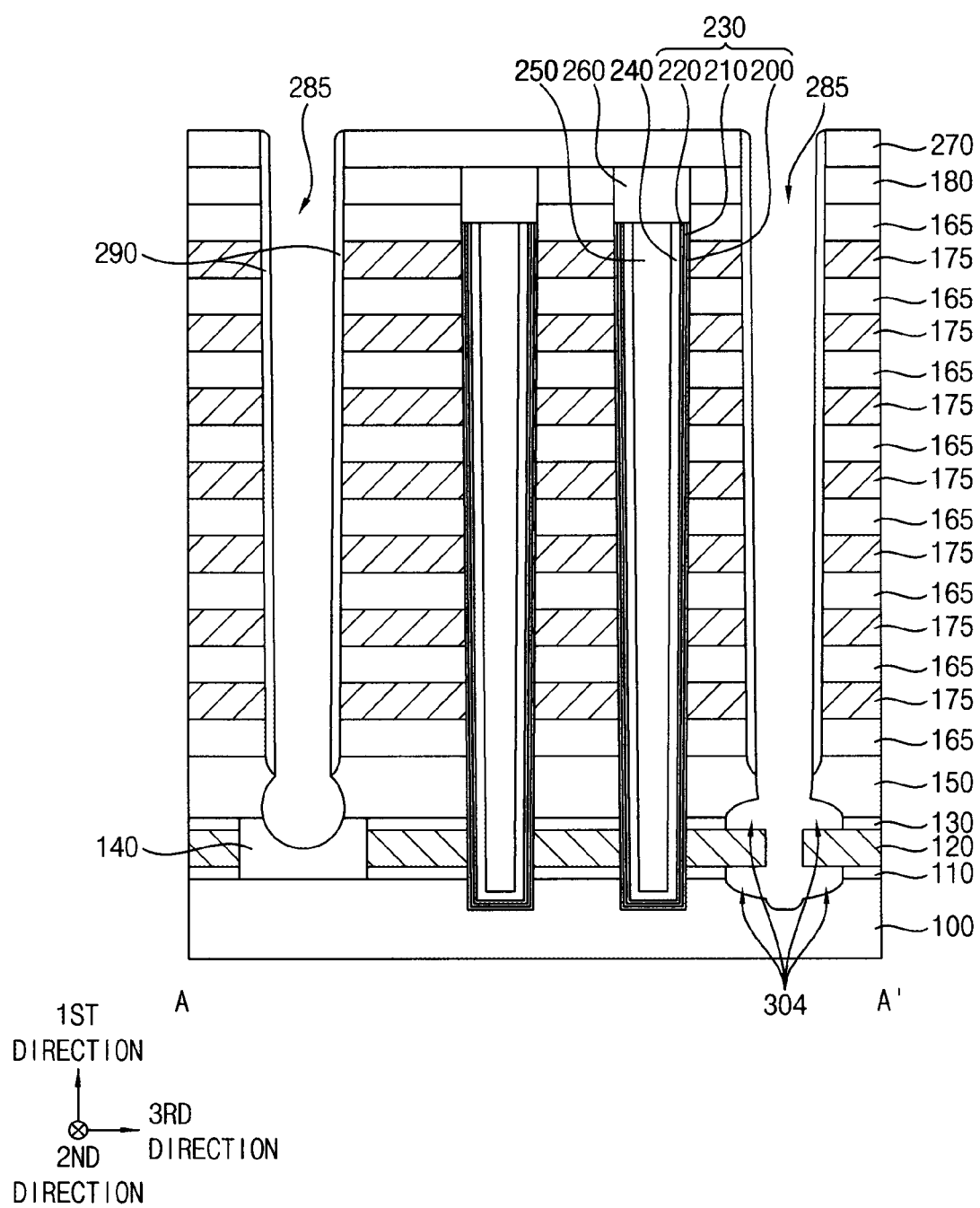

Referring to FIG. 14, the lower portion of the support layer 150 and the upper portion of the substrate 100 exposed by the first gaps 302 may be removed.

In example embodiments, the lower portion of the support layer 150 and the upper portion of the substrate 100 exposed by the first gaps 302 may be removed by a wet etching process using, e.g., SC1, and, thus, the first gaps 302 may be enlarged upwardly and downwardly, i.e., in the first direction, to form second gaps 304, respectively.

In example embodiments, the substrate 100 and the support layer 150 may commonly include silicon, and lower ones and upper ones of the second gaps 304 may be generally symmetric with respect to a horizontal line therebetween, i.e., a line extending parallel to the third direction. In other embodiments, for example, the substrate 100 may include undoped single crystalline silicon, and the support layer 150 may include doped polysilicon, and, thus, the lower and upper ones of the second gaps 304 may have slightly different shapes from each other, respectively.

The wet etching process may have isotropic etching characteristics, and, thus, upper surfaces of the upper ones of the second gaps 304 may have a slope of which an absolute value may gradually increase away from the third opening 285 in the third direction, and lower surfaces of the lower ones of the second gaps 304 may have a slope of which an absolute value may gradually increase away from the third opening 285 in the third direction as shown in FIG. 14.

An upper portion of the support pattern 140 may be also removed during the wet etching process. Additionally, the first spacer 290 on the sidewall of the third opening 285 may also be partially removed, however, the first spacer 290 may still at least partially cover the sidewall of the third opening 285.

Figure 15:
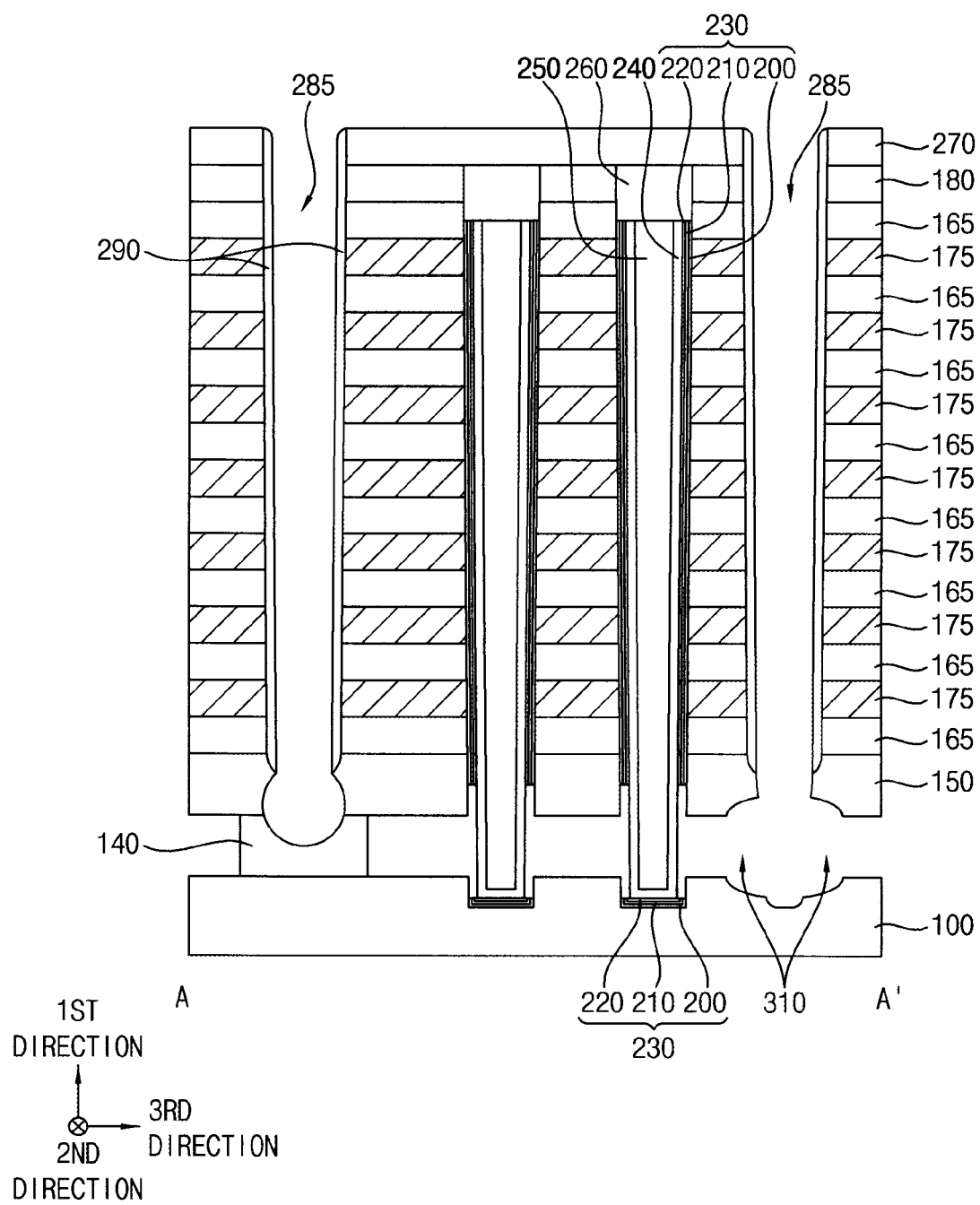

Referring to FIG. 15, the second sacrificial layer 120 exposed by the third opening 285 and the second gaps 304 may be removed, and the first and third sacrificial layers 110 and 130 may be removed to form a third gap 310.

In example embodiments, the second sacrificial layer 120 may be removed by a wet etching process using phosphoric acid ($H_3PO_4$), and the first and third sacrificial layers 110 and 130 may be removed by a wet etching process using hydrofluoric acid (HF).

As illustrated with reference to FIG. 14, the lower portion of the support layer 150 and the upper portion of the substrate 100 exposed by the first gaps 302 have already been removed, and, thus, a portion of the third gap 310 adjacent the third opening 285 may have a width in the first direction greater than widths in the first direction of other portions thereof, i.e., portions farther away from the third opening 285.

As the third gap 310 is formed, a portion of the charge storage structure 230 covering a lower outer sidewall of the channel 240 may be exposed, and the exposed portion of the charge storage structure 230 may be further removed to expose the lower outer sidewall of the channel 240.

The portion of the charge storage structure 230 may be removed by a wet etching process using phosphoric acid ($H_3PO_4$) or using hydrofluoric acid (HF). As the portion of the charge storage structure 230 is removed, the charge storage structure 230 may be divided into two pieces. That is, an upper portion of the charge storage structure 230 may extend through the mold to cover most of the outer sidewall of the channel 240, and a lower portion of the charge storage structure 230 may be formed on the substrate 100 to cover a bottom of the channel 240 as shown in FIG. 15.

Figure 16:
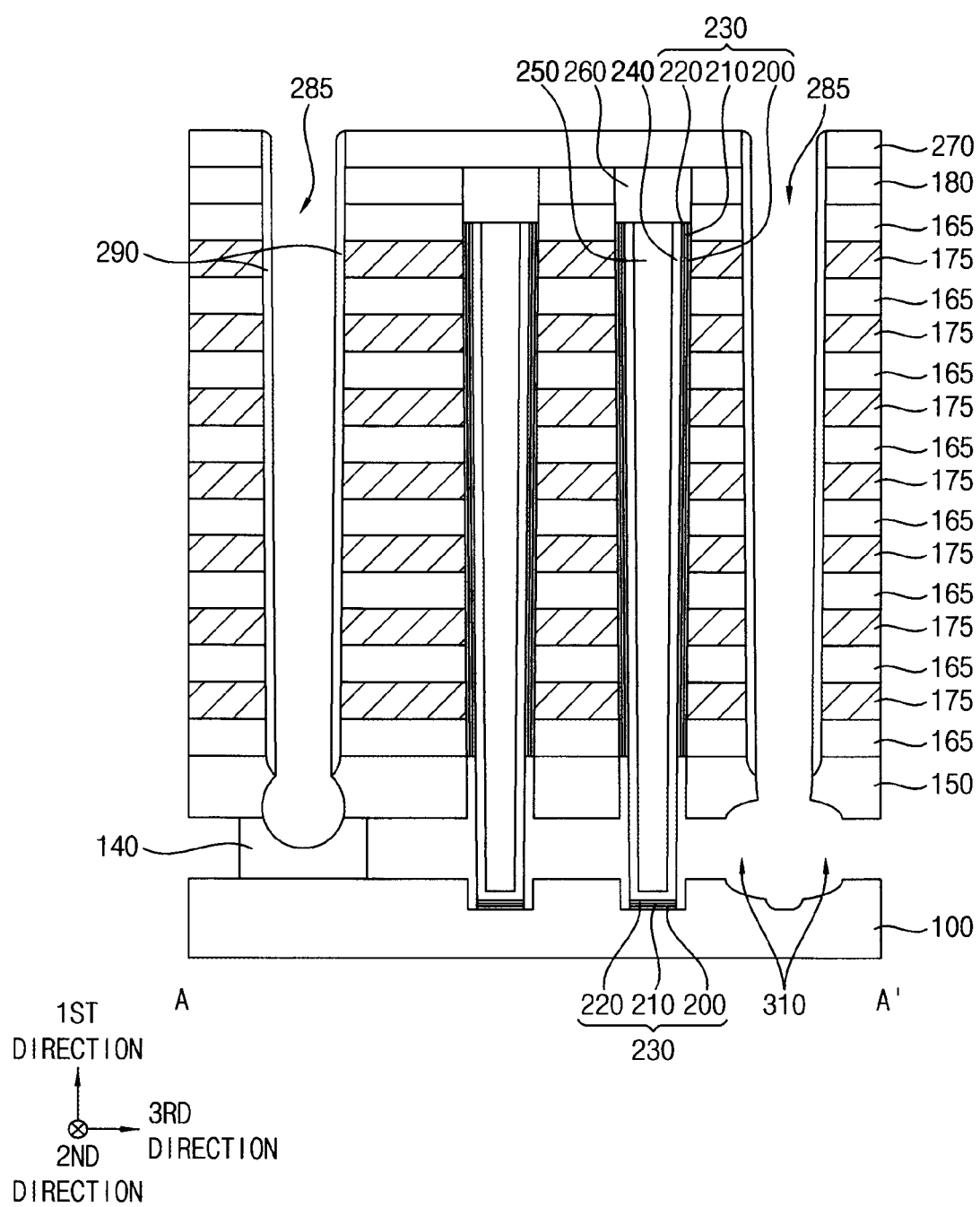

A portion of the third gap 310 adjacent the outer sidewall of the channel 240 may have an upper surface higher than a lower surface of the support layer 150, and may have a lower surface lower than the upper surface of the substrate 100 as shown in FIG. 15. FIG. 16 shows that the portion of the third gap 310 adjacent the outer sidewall of the channel 240 has an upper surface substantially coplanar with an upper surface of the support layer 150, and has a lower surface substantially coplanar with a lower surface of the charge storage structure 230.

When the third gap 310 is formed, the support pattern 140 may not be removed, and, thus, the mold may not collapse. Additionally, a bottom of the mold may be at least partially covered by the support layer 150 when the third gap 310 is formed, and, thus, a lower portion of the mold may not be removed.

Figure 17:
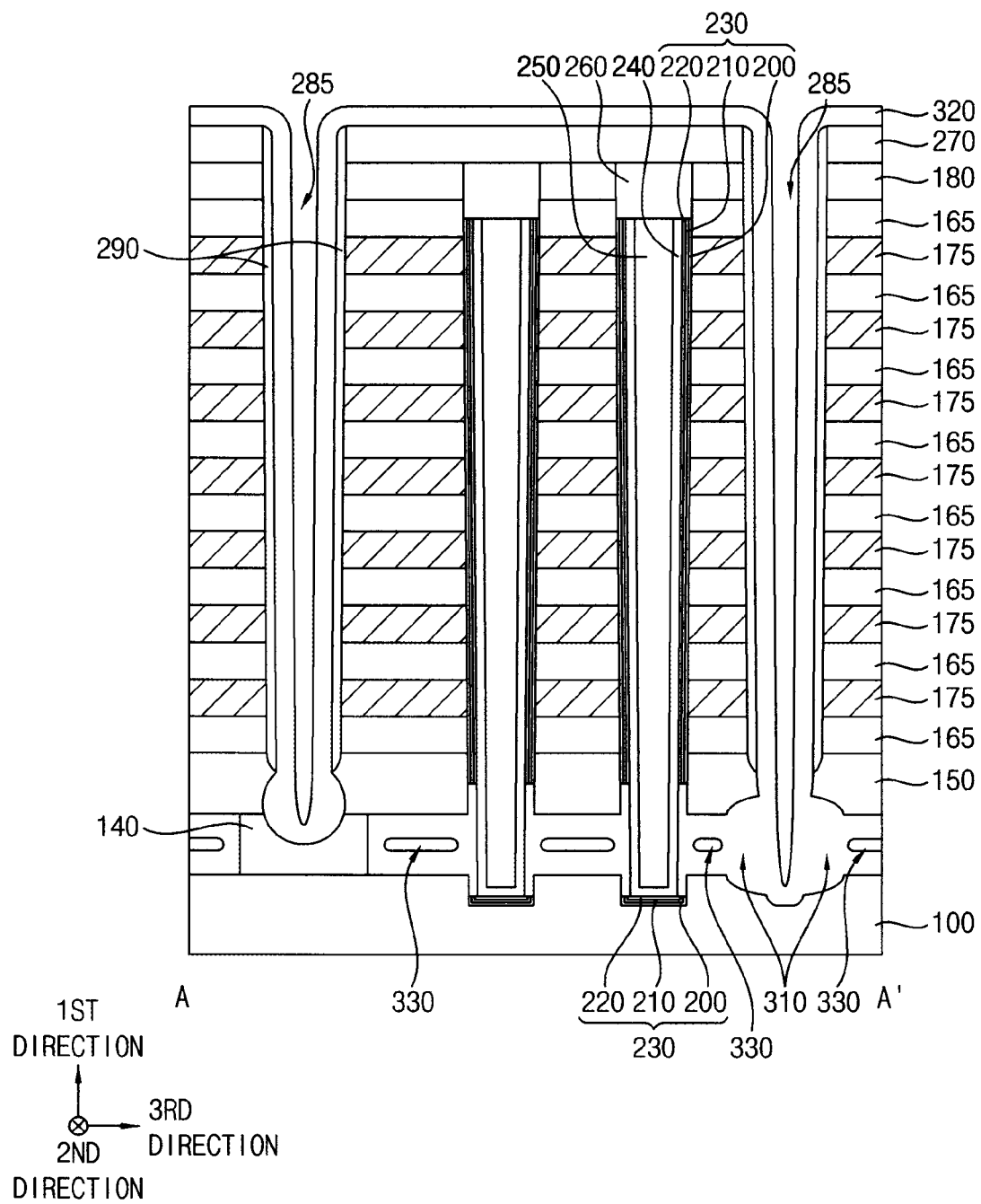

Referring to FIG. 17, a channel connecting layer 320 may be formed to at least partially fill the third gap 310.

The channel connecting layer 320 may in some embodiments fill the third gap 310, and may be further formed on a sidewall and a bottom of the third opening 285 and the upper surface of the second insulating interlayer 270. As the channel connecting layer 320 at least partially filling the third gap 310 is formed, the channels 240 forming the channel array may be connected with each other.

A portion of the channel connecting layer 320 in the third gap 310 may include an air gap 330 therein. In example embodiments, the air gap 330 may be formed in an area of the third gap 310 more distant from the third opening 285 in the third direction than other areas of the third gap 310. Thus, the air gap 330 may not be formed in areas that may correspond to the second gaps 304 and between the second gaps 304 as shown in FIG. 14. This is because the portion of the third gap 310 adjacent the third opening 285 may have a width in the first direction that is greater than the width in the first direction of other portions thereof more distant from the third opening 285, so as to be more readily filled with the channel connecting layer 320.

The channel connecting layer 320 may include, e.g., doped polysilicon.

Figure 18:
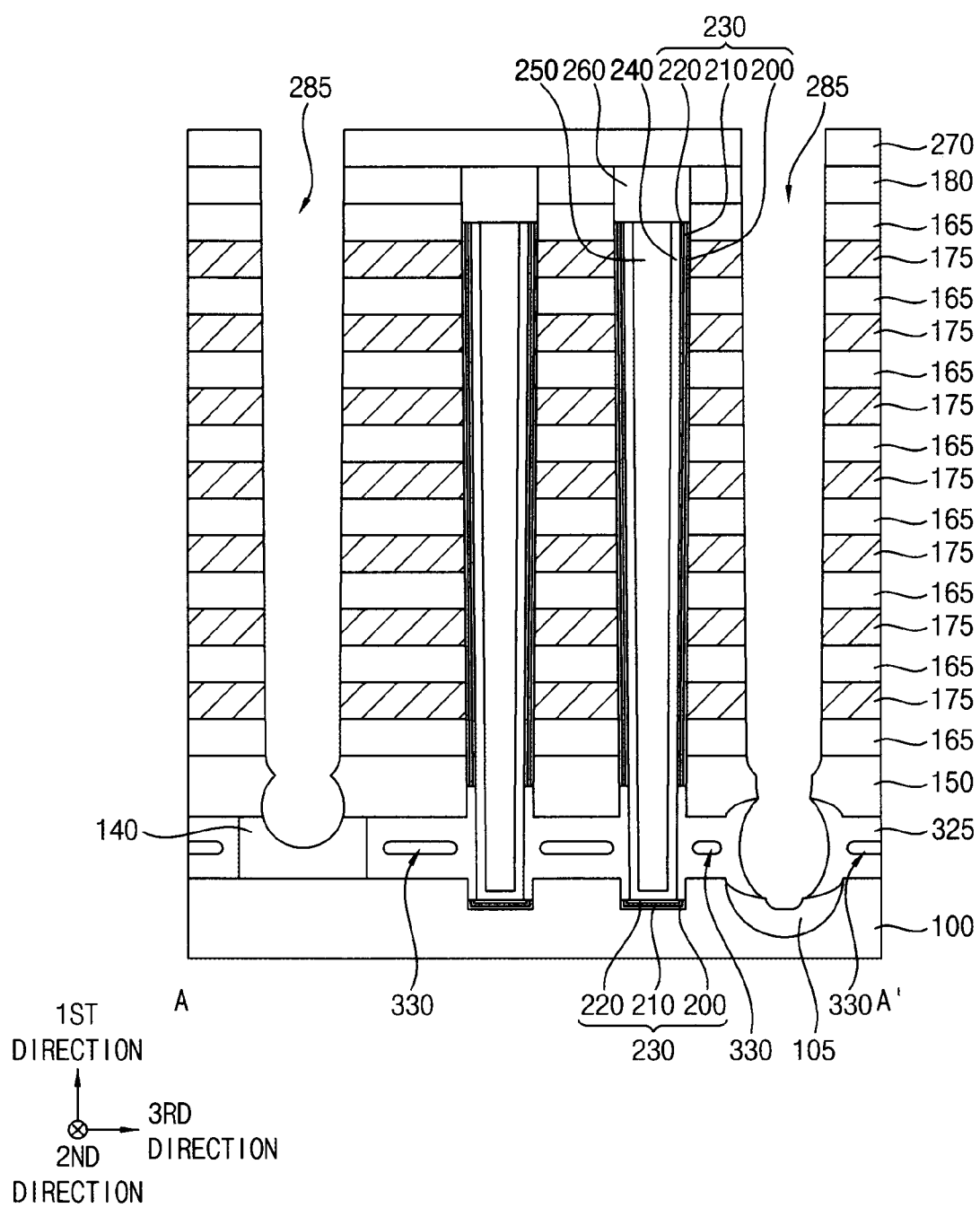

Referring to FIG. 18, the channel connecting layer 320 may be partially removed to form a channel connecting pattern 325 only in the third gap 310.

In example embodiments, the channel connecting pattern 325 may be formed by removing a portion of the channel connecting layer 320 in the third opening 285 through an etch back process. During the etch back process, the first spacer 290 on the sidewall of the third opening 285 may be also removed.

As illustrated above, even if the third gap 310 includes the air gap 330 in the channel connecting pattern 325, the air gap 330 may not be formed in the area adjacent to the third opening 285. Thus, even if the portion of the channel connecting layer 320 in the third opening 285 is removed, the air gap 330 may not be exposed.

Impurities may be implanted into an upper portion of the substrate 100 exposed by the third opening 285 to form an impurity region 105. In example embodiments, the impurity region 105 may contact a lower surface of the channel connecting pattern 325, and, thus, may be electrically connected to the channel connecting pattern 325 including doped polysilicon.

Figure 19:
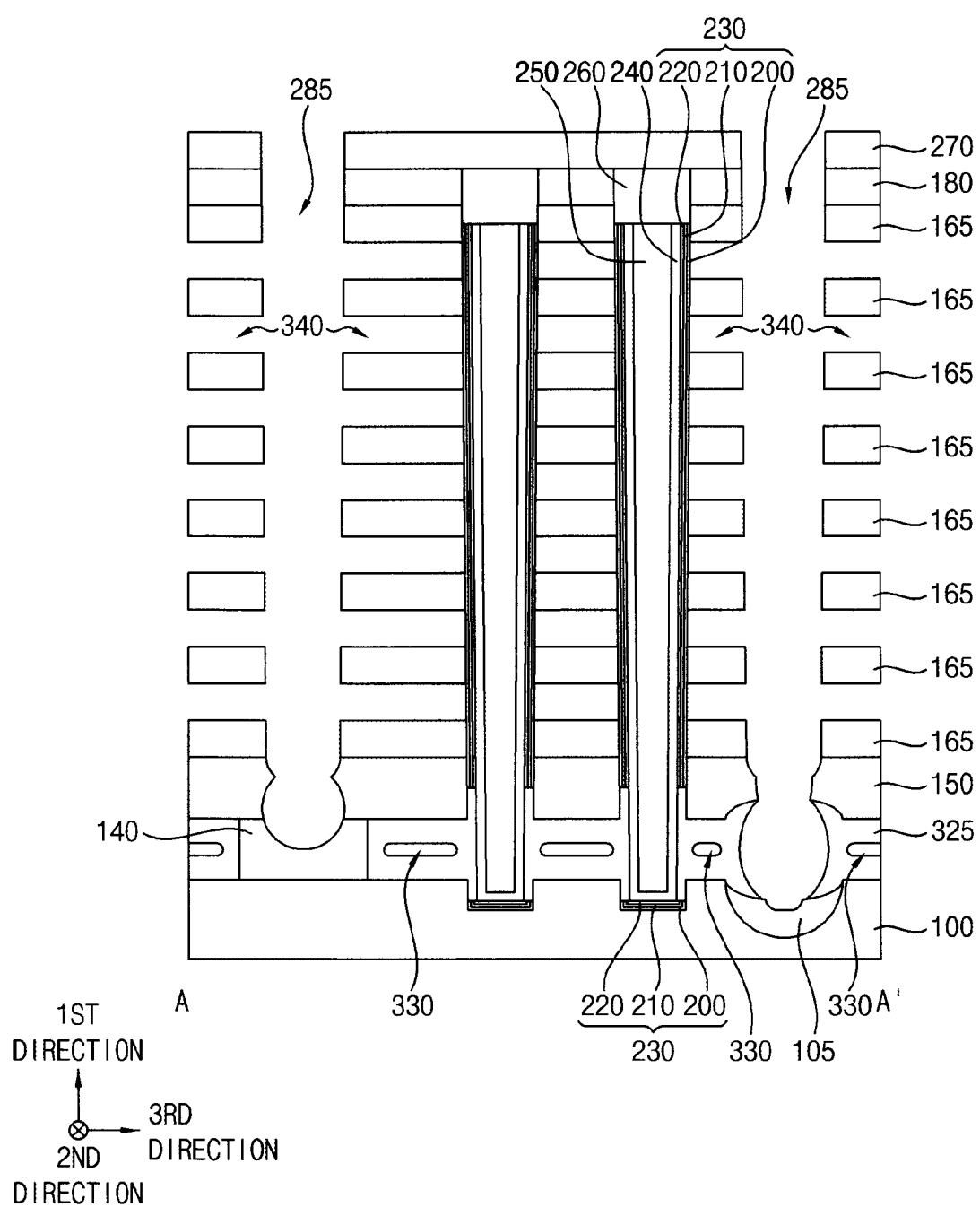

Referring to FIG. 19, the fourth sacrificial patterns 175 exposed by the third opening 285 may be removed to form a fourth gap 340 between the insulation patterns 165 at the respective levels, and an outer sidewall of the first blocking pattern 200 may be partially exposed by the fourth gap 340.

In example embodiments, the fourth sacrificial patterns 175 may be removed by a wet etching process using phosphoric acid or sulfuric acid.

Figure 20:
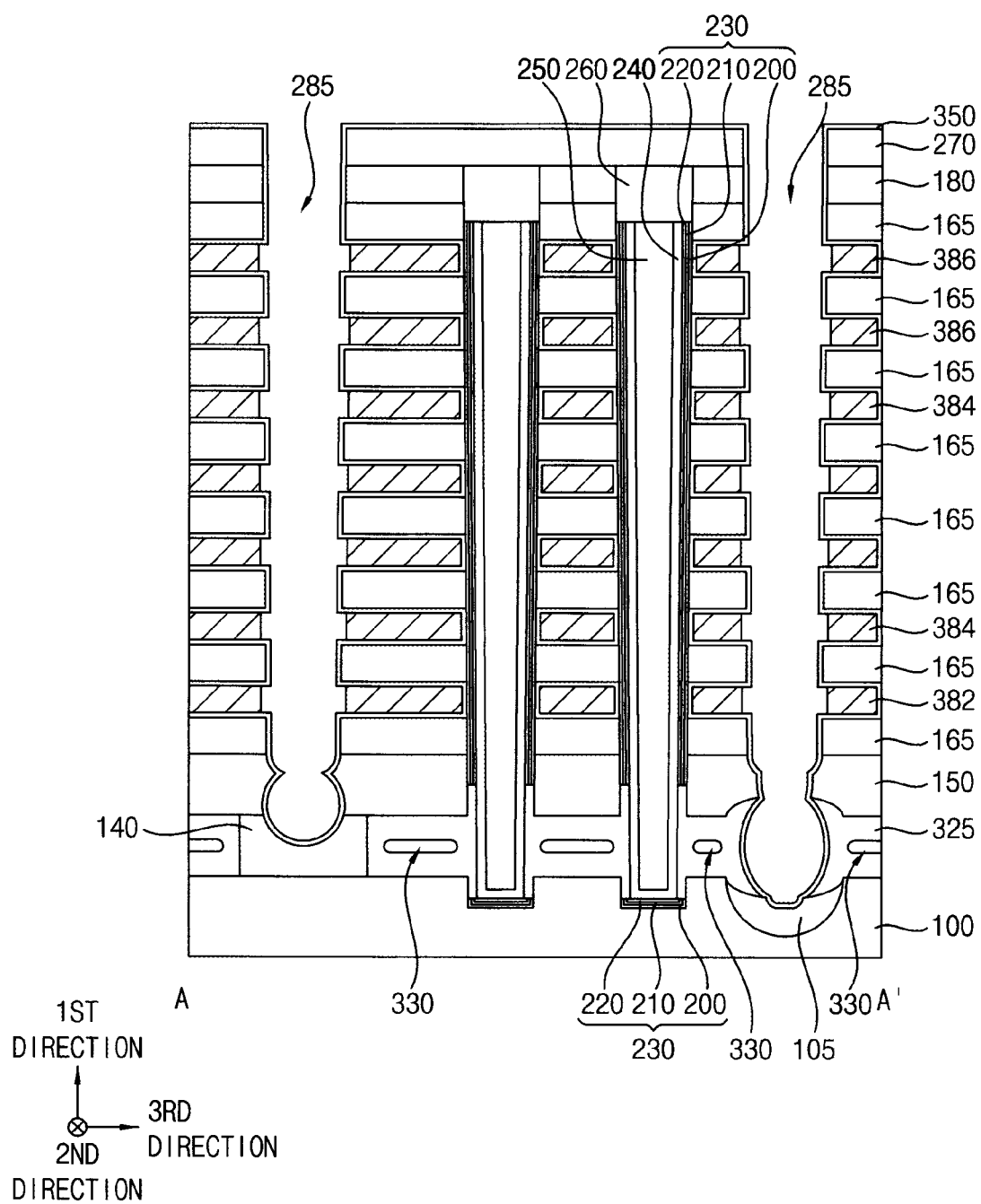

Referring to FIG. 20, a second blocking pattern 350 may be formed on the exposed outer sidewall of the first blocking pattern 200, inner walls of the second gaps 304 (defined by the channel connecting pattern 325), surfaces of the insulation patterns 165, sidewalls of the support layer 150 and the channel connecting layer 320, the upper surface of the substrate 100, an upper surface of the support pattern 140, and the upper surface of the second insulating interlayer 270, and a gate electrode layer may be formed on the second blocking pattern 350.

The gate electrode layer may include a gate barrier layer and a gate conductive layer sequentially stacked. The gate electrode layer may include a low resistance metal, e.g., tungsten, titanium, tantalum, platinum, etc., and the gate barrier layer may include a metal nitride, e.g., titanium nitride, tantalum nitride, etc.

The gate electrode layer may be partially removed to form a gate electrode 382, 384, 386 in each of the fourth gaps 340. In example embodiments, the gate electrode layer may be partially removed by a wet etching process, and, thus, the gate electrode layer may entirely or partially fill each of the fourth gaps 340.

The gate electrode may extend in the second direction, and a plurality of gate electrodes 382, 384, 386 may be formed in the third direction. That is, the gate electrodes each of which may extend in the second direction may be spaced apart from each other by the third opening 285.

In example embodiments, the gate electrodes 382, 384, 386 may be formed at a plurality of levels spaced apart from each other in the first direction, and the gate electrodes 382, 384, 386 at the plurality of levels may form a gate electrode structure. The gate electrode structure may include at least one first gate electrode 382, a plurality of second gate electrodes 384, and at least one third gate electrode 386. The number of levels at which the first to third gate electrodes 382, 384 and 386 are formed may be changed according to the number of levels of the fourth sacrificial layers 170.

Figure 21:
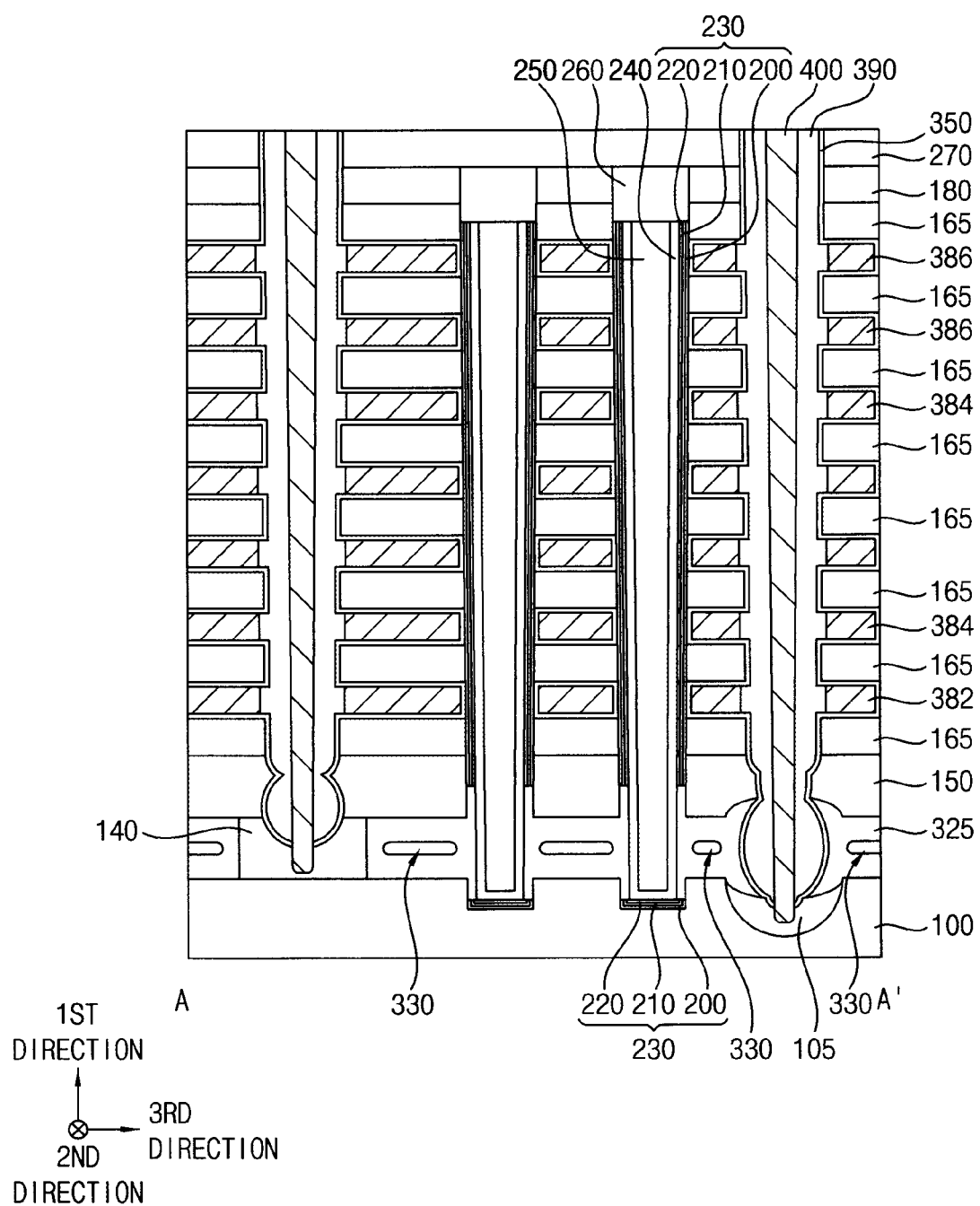

Referring to FIG. 21, a second spacer layer may be formed on the second blocking pattern 350 and anisotropically etched to form a second spacer 390 on the sidewall of the third opening 285, and, thus, an upper surface of the second blocking pattern 350 may be partially exposed.

A portion of the second blocking pattern 350 not covered by the second spacer 390 may be etched, and a portion of the second blocking pattern 350 on the upper surface of the second insulating interlayer 270 may be also etched. Additionally, an upper portion of the substrate 100, that is, an upper portion of the impurity region 105 and an upper portion of the support pattern 140 may be removed.

A conductive layer may be formed on the upper surface of the substrate 100, the upper surface of the support pattern 140, the second spacer 390 and the second insulating interlayer 270 to fill a remaining portion of the third opening 285, and may be planarized until the upper surface of the second insulating interlayer 270 may be exposed to form a common source line (CSL) 400. The CSL 400 may include a metal, e.g., tungsten.

In example embodiments, the CSL 400 may extend in the first direction, and also in the second direction. A lower surface of the CSL 400 may be covered by the substrate 100, that is, the impurity region 105 as illustrated by the CSL 400 on the right in FIG. 21, and the support pattern 140 as illustrated by the CSL 400 on the left in FIG. 21. In other embodiments, the CSL 400 on the left in FIG. 21 may extend through the support pattern 140 so that a lower portion of the CSL 400 may be at least partially covered by the substrate 100.

Referring again to FIGS. 1 to 3, after forming a third insulating interlayer 410 on the second insulating interlayer 270, the CSL 400, the second spacer 390, and the second blocking pattern 350, a contact plug 420 may be formed through the second and third insulating interlayers 270 and 410 to contact an upper surface of the capping pattern 260. A fourth insulating interlayer 430 may be formed on the third insulating interlayer 410 and the contact plug 420, and a bit line 440 may be formed through the fourth insulating interlayer 430 to contact an upper surface of the contact plug 420.

As illustrated above, the vertical memory device may be fabricated by forming the first to third sacrificial layers 110, 120 and 130, the support layer 150, and the mold having the insulation layer 160 and the fourth sacrificial layer 170 alternately and repeatedly stacked, forming the channel 240 and the third opening 285 through the mold, the support layer 150, and the first to third sacrificial layers 110, 120 and 130, removing the first to third sacrificial layers 110, 120 and 130 through the third opening 285 to form the first gaps 302, removing the lower portion of the support layer 150 and the upper portion of the substrate 100 through the first gaps 302 to form the second gaps 304, partially removing the first to third sacrificial layers 110, 120 and 130 and the charge storage structure 230 through the third opening 285 and the second gaps 304 to form the third gap 310, forming the channel connecting layer 320 in the third gap 310 and the third opening 285, removing the portion of the channel connecting layer 320 in the third opening 285 to foil the channel connecting pattern 325, and replacing the fourth sacrificial layer 170 with the gate electrodes 382, 384, 386.

Before forming the third gap 310, the lower portion of the support layer 150 and the upper portion of the substrate 100 exposed by the first gaps 302 have already been removed, and, thus, the width in the first direction of the portion of the third gap 310 adjacent the third opening 285 may be greater than the widths in the first direction of other portions of the third gap 310 more distant from the third opening 285. Accordingly, even if the portion of the channel connecting layer 320 in the third gap 310 includes the air gap 330, the air gap 330 may not be formed in the area adjacent the third opening 285 but may be formed in the area more distant from the third opening 285.

Thus, when the portion of the channel connecting layer 320 in the third opening 285 is removed to form the channel connecting pattern 325, the air gap 330 may not be exposed, and during the replacement process in which the fourth sacrificial layer 170 may be replaced with the gate electrode layer, a metal may not infiltrate into the air gap 330 so that a risk of degrading the characteristics of the vertical memory device may be reduced.

Figure 22:
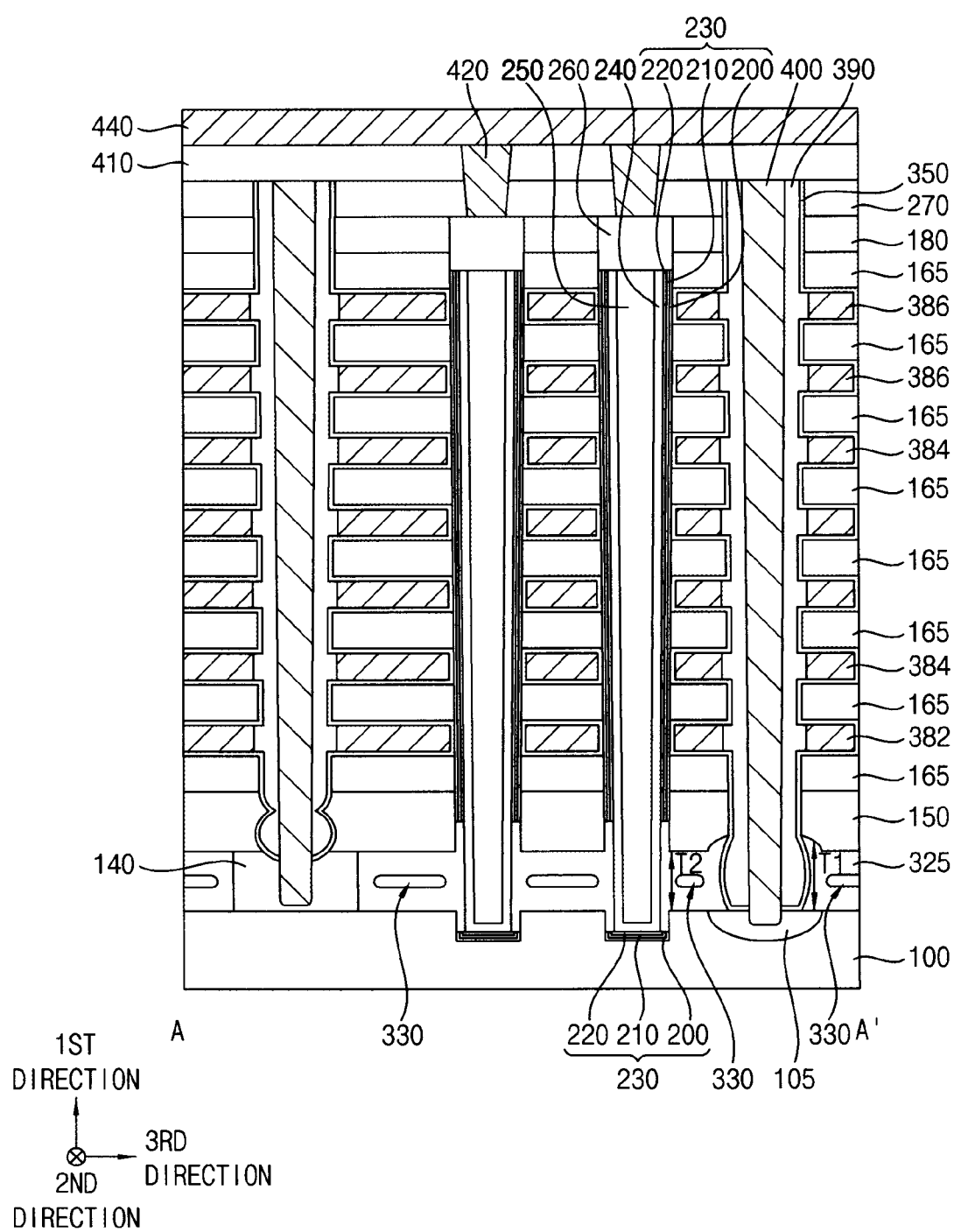
FIG. 22 is a cross-sectional view illustrating a vertical memory device in accordance with further example embodiments of the inventive concept.

FIG. 22 is a cross-sectional view illustrating a vertical memory device in accordance with example embodiments of the inventive concept. This vertical memory device may be substantially the same as or similar to that of FIGS. 1 to 3, except for the shape of the channel connecting pattern 325. Thus, like reference numerals refer to like elements, and detailed descriptions thereof are omitted herein.

Referring to FIG. 22, other portions of the channel connecting pattern 325 except for the portion thereof adjacent the channel 240 may have a flat lower surface having a generally constant or uniform height. That is, even the end portion of the channel connecting pattern 325 adjacent the CSL 400 may have a lower surface substantially coplanar with the lower surface of the other portions of the channel connecting pattern 325.

However, the end portion of the channel connecting pattern 325 may have an upper surface in areas adjacent to the CSL 400 that is higher than that of the other portions of the channel connecting pattern 325 more distant from the CSL 400, such as, for example, areas adjacent the channel 240. Thus, the first thickness T1 in the first direction of the end portion of the channel connecting pattern 325 may be greater than the second thickness T2 in the first direction of the other portions except for the portion thereof adjacent the channel 240.

FIGS. 23 to 26 are cross-sectional views illustrating a method of manufacturing a vertical memory device in accordance with example embodiments of the inventive concept. This method may include processes substantially the same as or similar to those illustrated with reference to FIGS. 4 to 21 and FIGS. 1 to 3, and, thus, detailed descriptions thereof are omitted herein.

Figure 23:
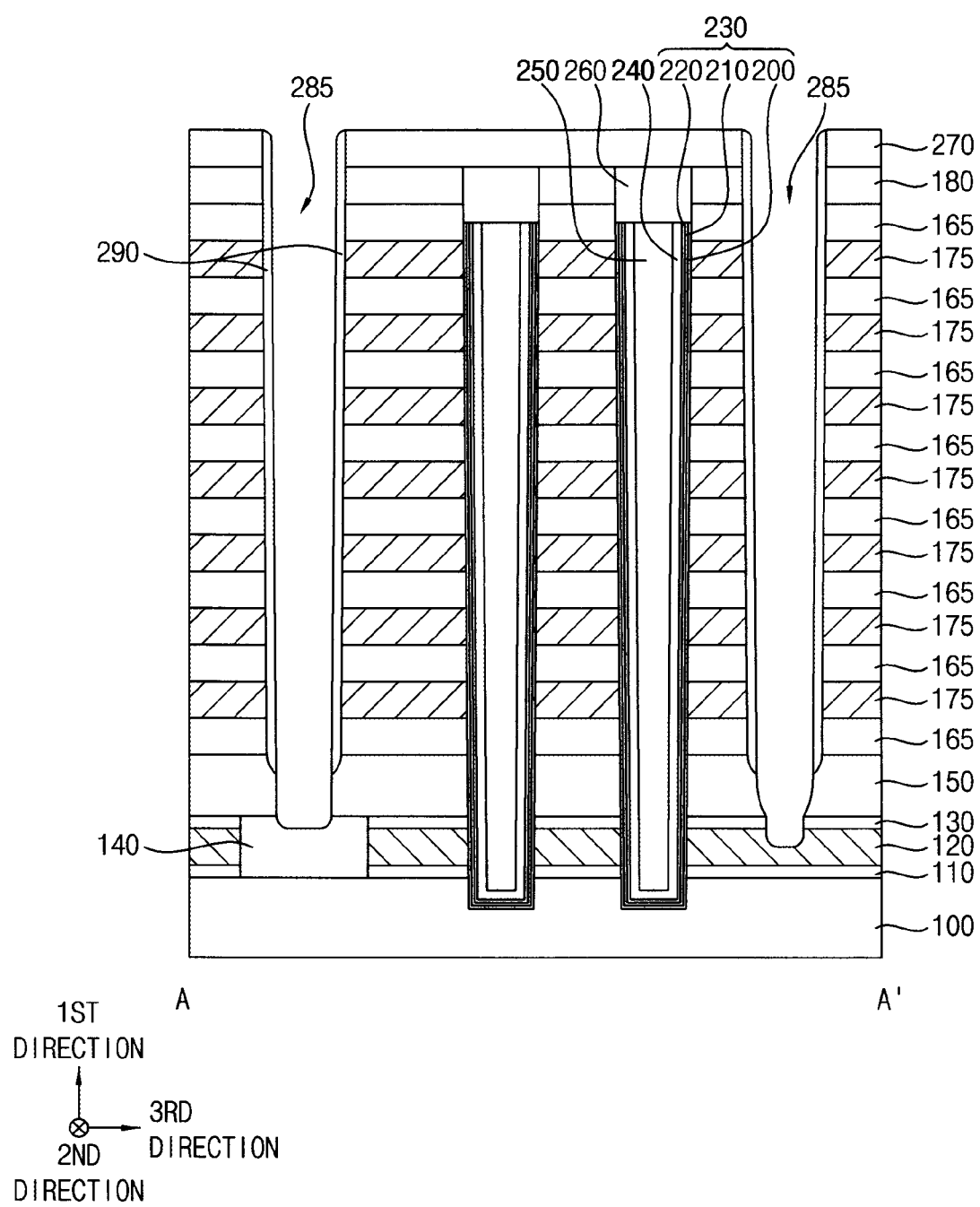
FIGS. 23 to 26 are cross-sectional views illustrating a method of manufacturing a vertical memory device in accordance with further example embodiments of the inventive concept.

Referring to FIG. 23, processes substantially the same as or similar to those illustrated with reference to FIGS. 4 to 12 may be performed.

However, in contrast to the embodiments illustrated in FIG. 12, the third opening 285 may expose the second sacrificial layer 120 instead of the upper surface of the substrate 100, and may further extend through an upper portion of the second sacrificial layer 120. However, the third opening 285 may not expose the first sacrificial layer 110 and the substrate 100.

Figure 24:
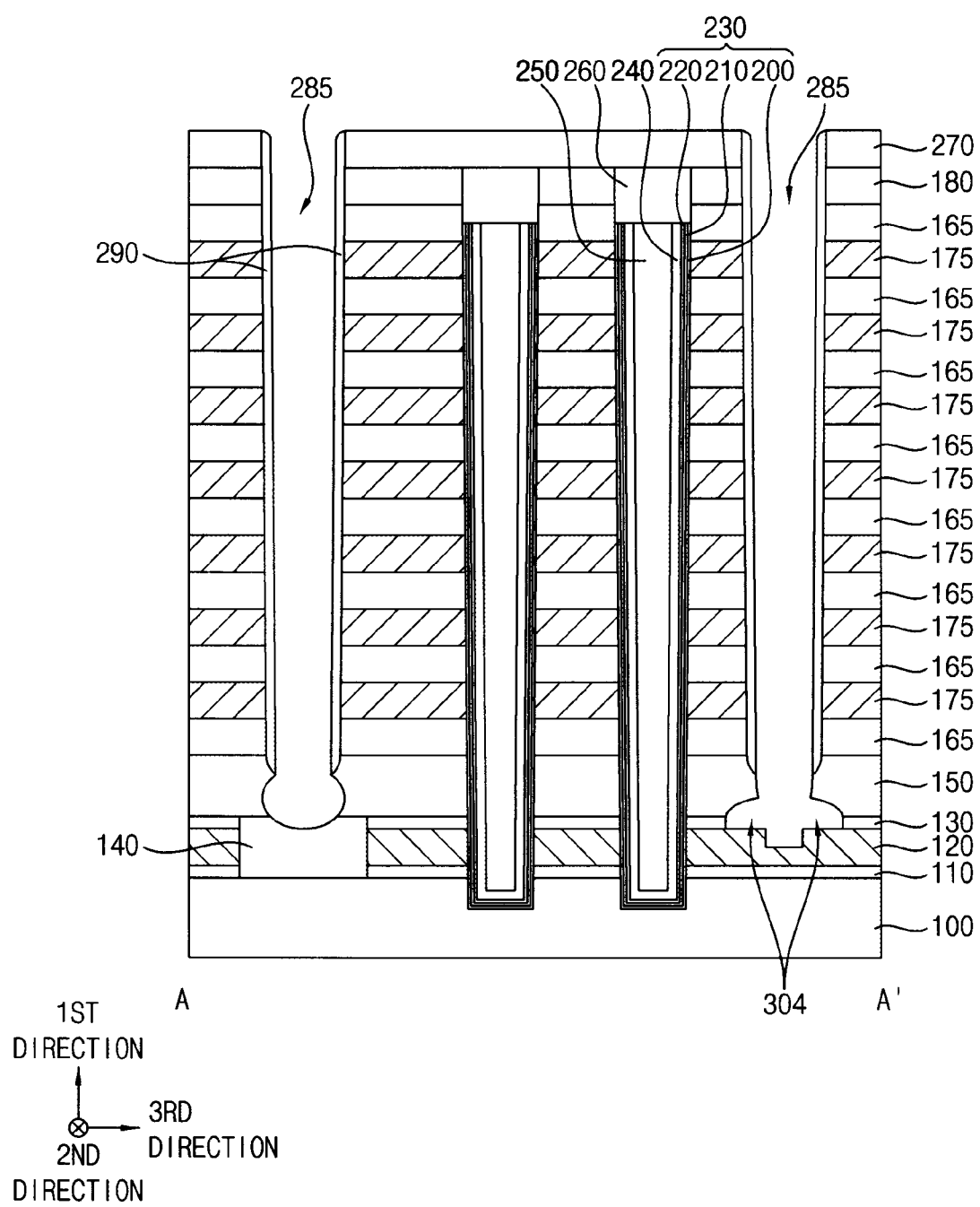

Referring to FIG. 24, processes substantially the same as or similar to those illustrated with reference to FIGS. 13 and 14 may be performed.

However, in contrast to the embodiments illustrated in FIG. 14, the first sacrificial layer 110 and the substrate 100 may not be exposed by the third opening 285, and, thus, only a portion of the third sacrificial layer 130 and a portion of the support layer 150 thereon may be removed to form the second gap 304, and the second gap 304 may not be formed in the first sacrificial layer 110 and the upper portion of the substrate 100.

Figure 25:
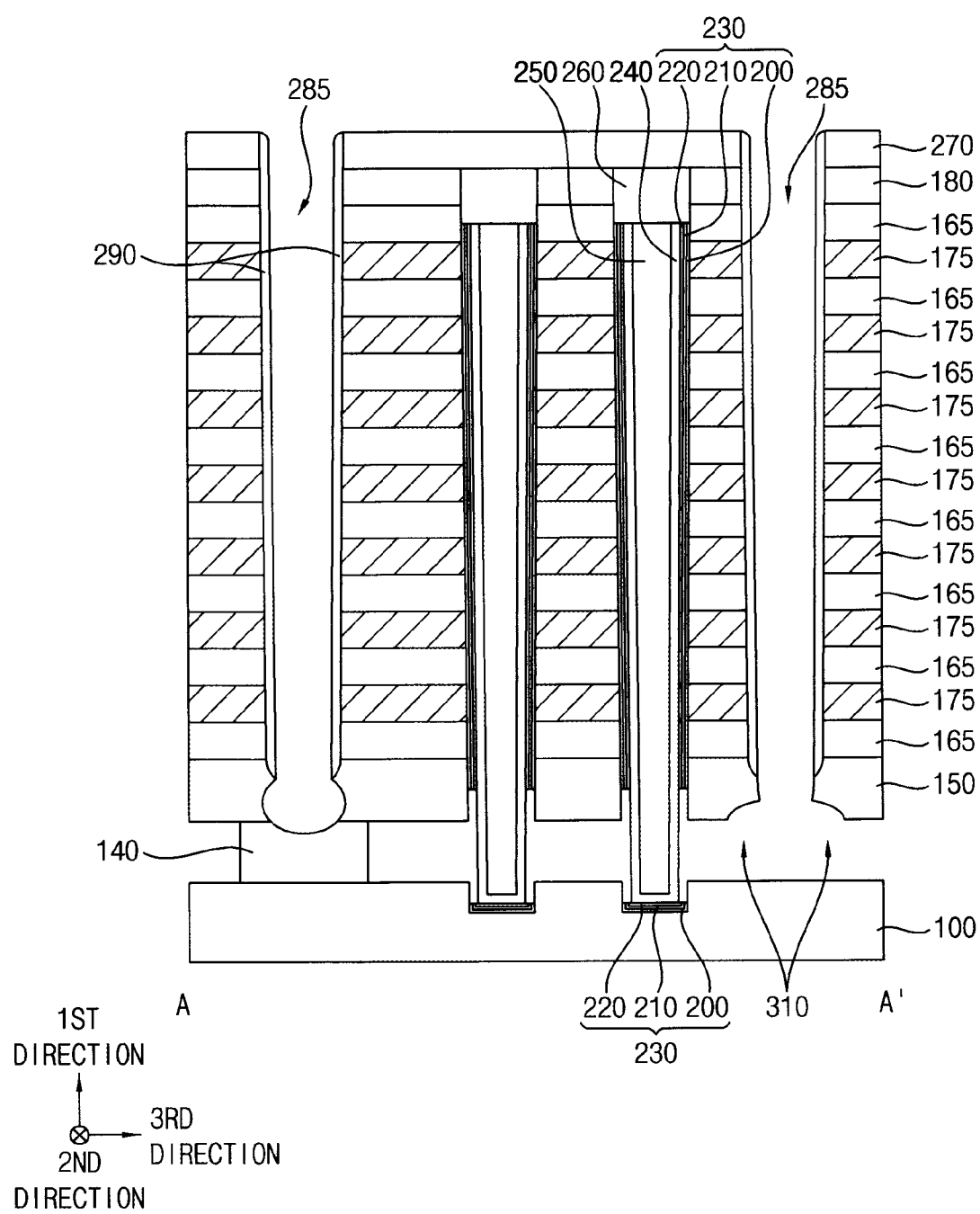

Referring to FIG. 25, processes substantially the same as or similar to those illustrated with reference to FIG. 15 may be performed.

Thus, the third gap 310 may be formed between the upper surface of the substrate 100 and the lower surface of the support layer 150. In contrast to the embodiments of FIG. 15, a lower surface of a portion of the third gap 310 adjacent the third opening 285 may be substantially coplanar with a lower surface of other portions thereof, except for a lower surface of a portion thereof adjacent the channel 240. However, an upper surface of the portion of the third gap 310 adjacent the third opening 285 may be higher than an upper surface of other portions thereof, except for an upper surface of the portion thereof adjacent the channel 240.

Figure 26:
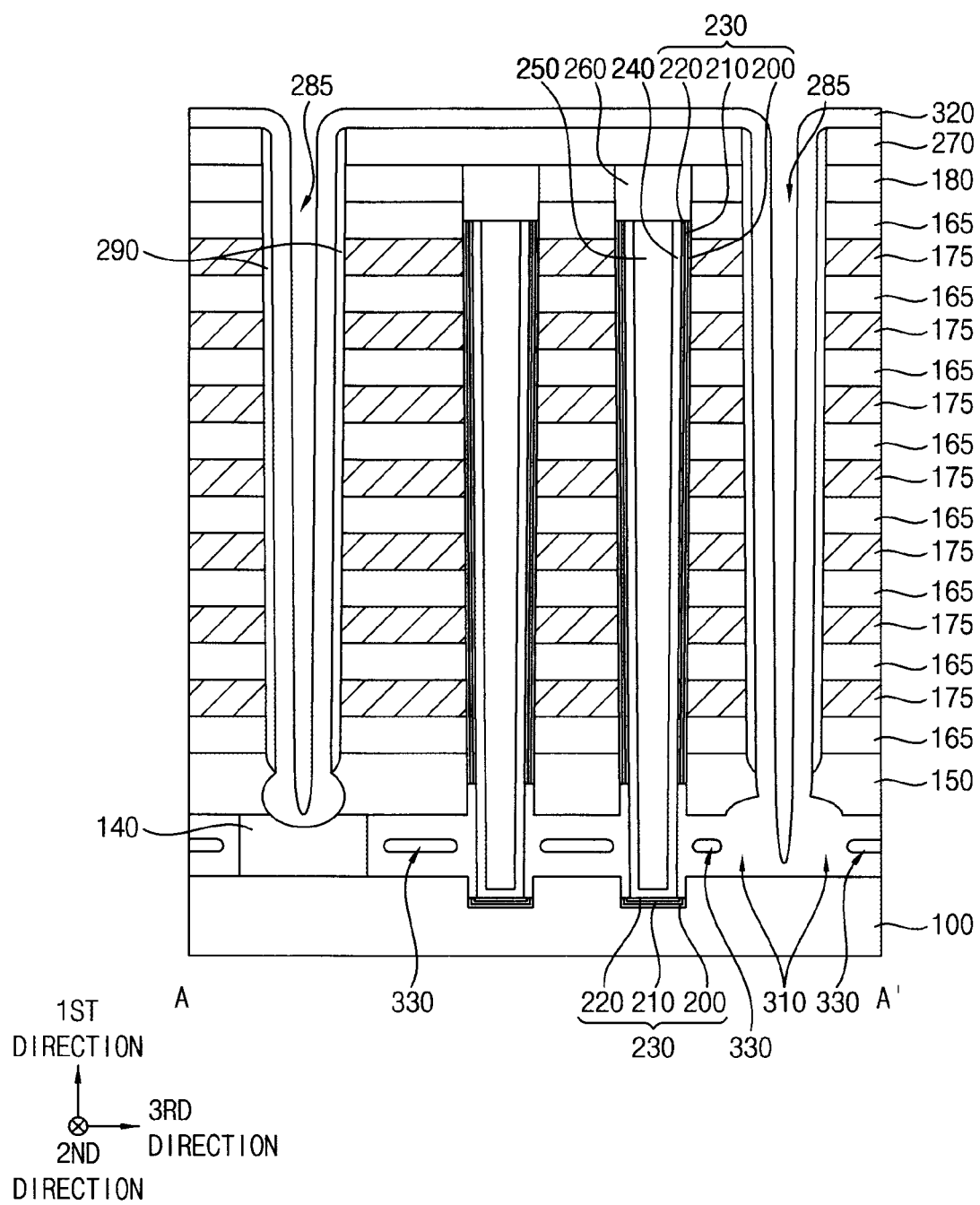

Referring to FIG. 26, processes substantially the same as or similar to those illustrated with reference to FIG. 17 may be performed.

Thus, the channel connecting layer 320 may be formed in the third gap 310 and the third opening 285, and a portion of the channel connecting layer 320 in the third gap 310 may include the air gap 330 therein. A width in the first direction of the portion of the third gap 310 adjacent the third opening 285 may be greater than a width in the first direction of other portions thereof more distant from the third opening 285, and, thus, the air gap 330 may not be formed in an area adjacent the third opening 285 but be formed in an area more distant from the third opening 285 in the third direction.

Referring to FIG. 22 again, processes substantially the same as or similar to those illustrated with reference to FIGS. 18 to 21 and FIGS. 1 to 3 may be performed to complete the fabrication of the vertical memory device.

Figure 27A:
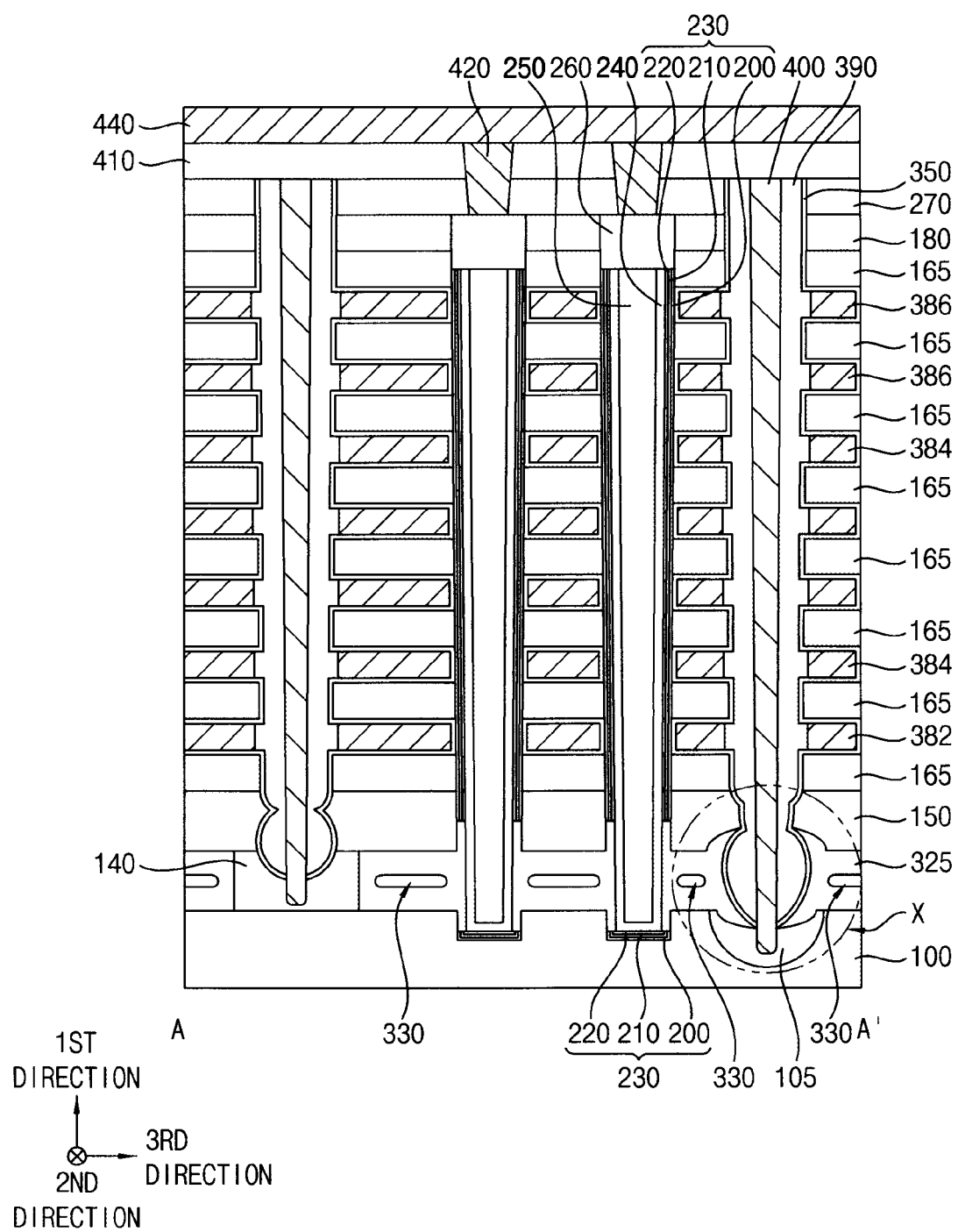
FIGS. 27A and 27B are cross-sectional views illustrating a vertical memory device in accordance with further example embodiments of the inventive concept.
Figure 27B:
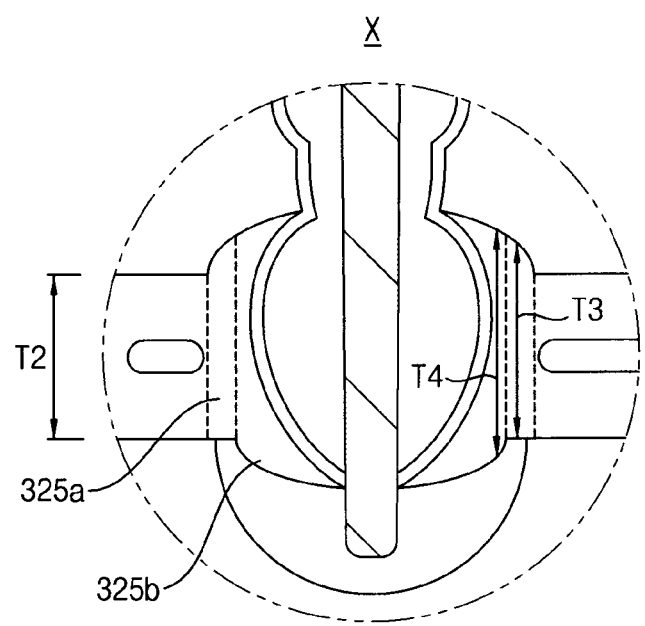

FIGS. 27A and 27B are cross-sectional views illustrating a vertical memory device in accordance with example embodiments of the inventive concept. FIG. 27B is an enlarged cross-sectional view of a region X of FIG. 27A.

The vertical memory device embodiments of FIGS. 27A and 27B may be substantially the same as or similar to that of FIGS. 1 to 3, except for the shape of the channel connecting pattern 325. Thus, like reference numerals refer to like elements, and detailed descriptions thereof are omitted herein.

Referring to FIGS. 27A and 27B, an end portion in the third direction of the channel connecting pattern 325 adjacent the CSL 400 may have an upper surface higher than an upper surface of other portions thereof more distant from the CSL 400 except for a portion thereof immediately adjacent to the channel 240. That is, the end portion in the third direction of the channel connecting pattern 325 adjacent the CSL 400 may not be flat but have a curvature.

However, in example embodiments shown in FIG. 27B, the end portion of the channel connecting pattern 325 may include a first portion 325a of which a lower surface may be substantially coplanar with a lower surface of the other portions thereof except for the portion thereof immediately adjacent the channel 240 and a second portion 325b of which a lower surface may be lower than the lower surface of the other portions thereof except for the portion thereof adjacent the channel 240.

Accordingly, a fourth thickness T4 of the second portion 325b of the end portion of the channel connecting pattern 325 in the first direction may be greater than a third thickness T3 of the first portion 325a of the end portion of the channel connecting pattern 325 in the first direction. However, the third thickness T3 of the first portion 325a of the channel connecting pattern 325 in the first direction may be greater than the second thickness T2 of the other portions except for the portion adjacent the channel 240 of the channel connecting pattern 325 in the first direction.

In other embodiments, the end portion of the channel connecting pattern 325 may be defined as a portion of the channel connecting pattern 325 having a lower surface that may be lower than a lower surface of other portions except for the portion immediately adjacent the channel 240 of the channel connecting pattern 325. In this case, the lower surface of the end portion of the channel connecting pattern 325 may not be flat but have a curvature. In example embodiments, a distance from an upper surface of the end portion of the channel connecting pattern 325 to the channel 240 or the charge storage structure 230 may be smaller than a distance from the lower surface of the end portion of the channel connecting pattern 325 to the channel 240 or the charge storage structure 230.

A curvature of the upper surface of the end portion of the channel connecting pattern 325 may be different from a curvature of the lower surface of the end portion of the channel connecting pattern 325. In example embodiments, the curvature of the upper surface of the end portion of the channel connecting pattern 325 may be smaller than the curvature of the lower surface of the end portion of the channel connecting pattern 325.

Figure 28:
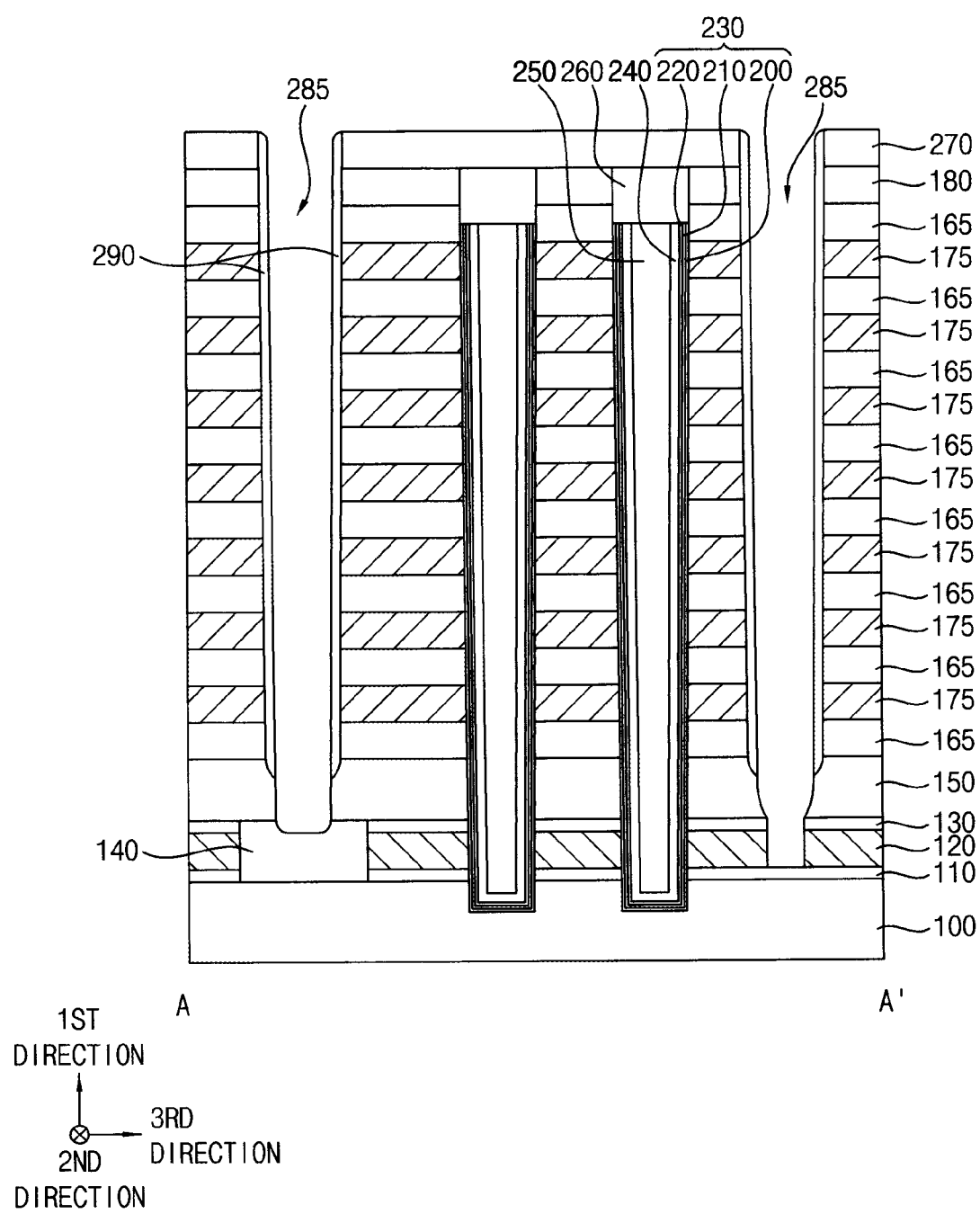
FIGS. 28 and 29 are cross-sectional views illustrating a method of manufacturing a vertical memory device in accordance with further example embodiments of the inventive concept.
Figure 29:
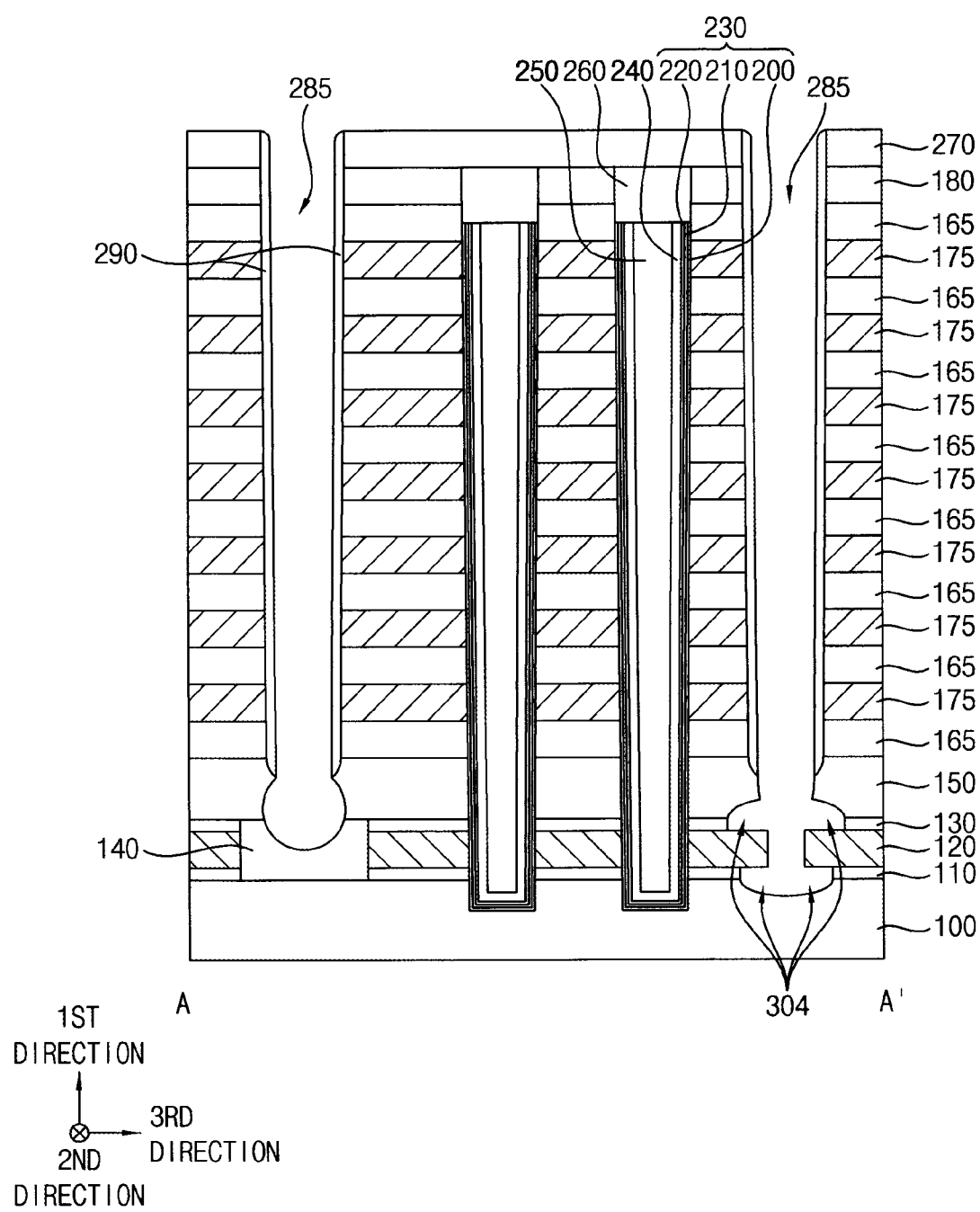

FIGS. 28 and 29 are cross-sectional views illustrating a method of manufacturing a vertical memory device in accordance with example embodiments of the inventive concept. This method may include processes substantially the same as or similar to those illustrated with reference to FIGS. 4 to 21 and FIGS. 1 to 3, and thus detailed descriptions thereof are omitted herein.

Referring to FIG. 28, processes substantially the same as or similar to those illustrated with reference to FIGS. 4 to 12 may be performed.

However, in contrast to the embodiments of FIG. 12, the third opening 285 may expose an upper surface of the second sacrificial layer 120 instead of exposing the upper surface of the substrate 100, and may not expose the upper surface of the substrate 100.

Referring to FIG. 29, processes substantially the same as or similar to illustrated with reference to FIGS. 13 and 14 may be performed.

However, as shown in FIG. 28, the first sacrificial layer 110 has not been removed by the third opening 285 while the third sacrificial layer 130 has been partially removed, and thus upper and lower ones of the first gaps 302, which may be formed by removing the first and third sacrificial layers 110 and 130 illustrated with reference to FIG. 13, may have different widths from each other in the third direction. That is, the upper ones of the first gaps 302 may have a width in the third direction greater than a width in the third direction of the lower ones of the first gaps 302 as shown in the cross-sectional view of FIG. 29.

Accordingly, upper and lower ones of the second gaps 304, which may be formed by removing the support layer 150 and the substrate 100 exposed by the first gaps 302, may also have different widths from each other in the third direction. That is, the upper ones of the second gaps 304 may have a width in the third direction greater than a width in the third direction of the lower ones of the second gaps 304. Thus, a distance from the upper ones of the second gaps 304 to the channel 240 or the charge storage structure 230 may be smaller than a distance from the lower ones of the second gaps 304 to the channel 240 or the charge storage structure 230.

In example embodiments, a curvature of the upper ones of the second gaps 304 may be different from a curvature of the lower ones of the second gaps 304. That is, while the lower ones of the second gaps 304 may be formed by removing only the upper portion of the substrate 100 exposed by the first gaps 302, the upper ones of the second gaps 304 may be formed by removing not only the lower portion of the support layer 150 exposed by the first gaps 302 but also the sidewall of the support layer 150 exposed by the third opening 285, and thus the curvature of the upper ones of the second gaps 304 may be smaller than the curvature of the lower ones of the second gaps 304.

Referring again to FIGS. 27A and 28B, processes substantially the same as or similar to illustrated with reference to FIGS. 15 to 21 and FIGS. 1 to 3 may be performed to complete the fabrication of the vertical memory device.

Figure 30:
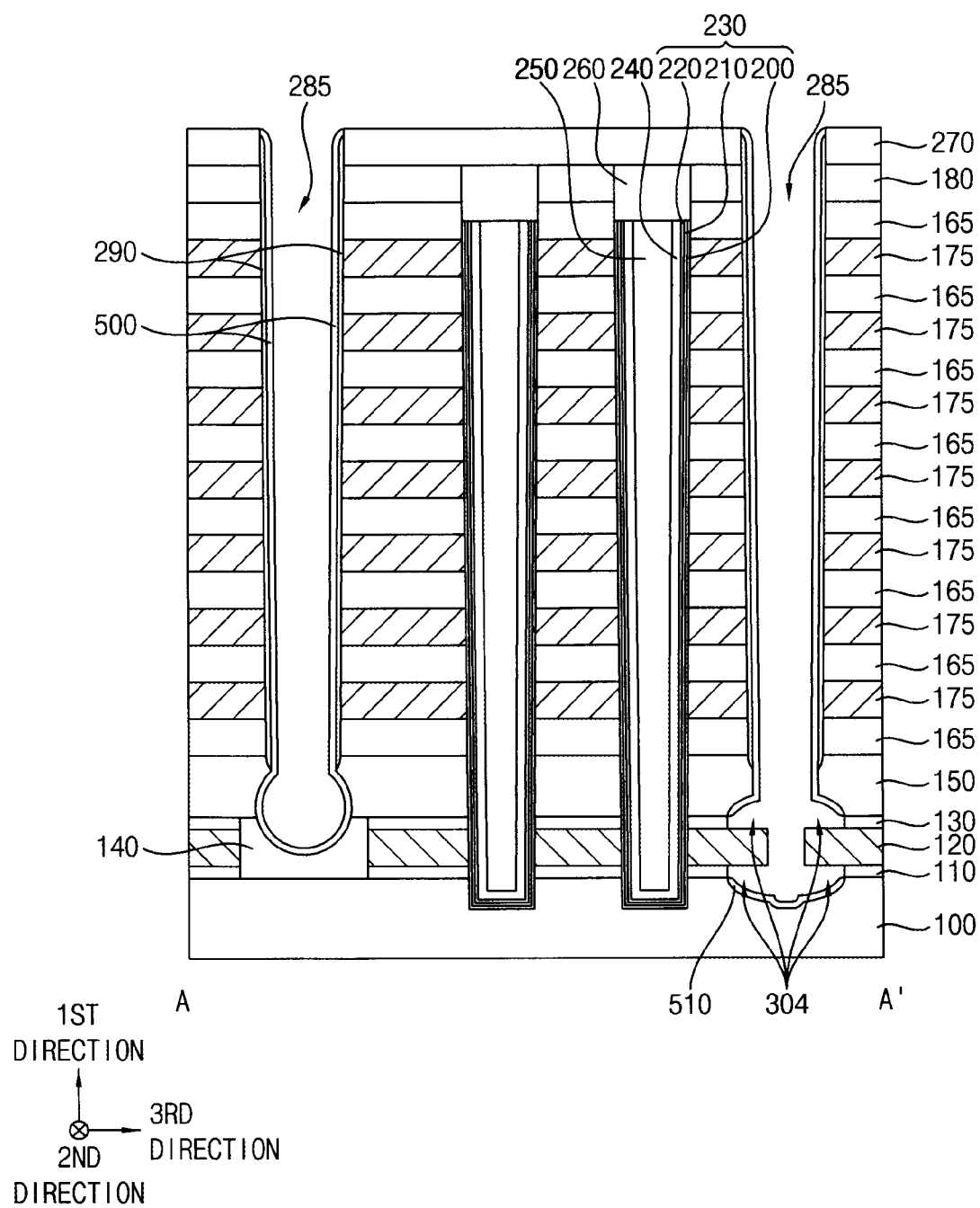
FIGS. 30 and 31 are cross-sectional views illustrating a method of manufacturing a vertical memory device in accordance with further example embodiments of the inventive concept.
Figure 31:
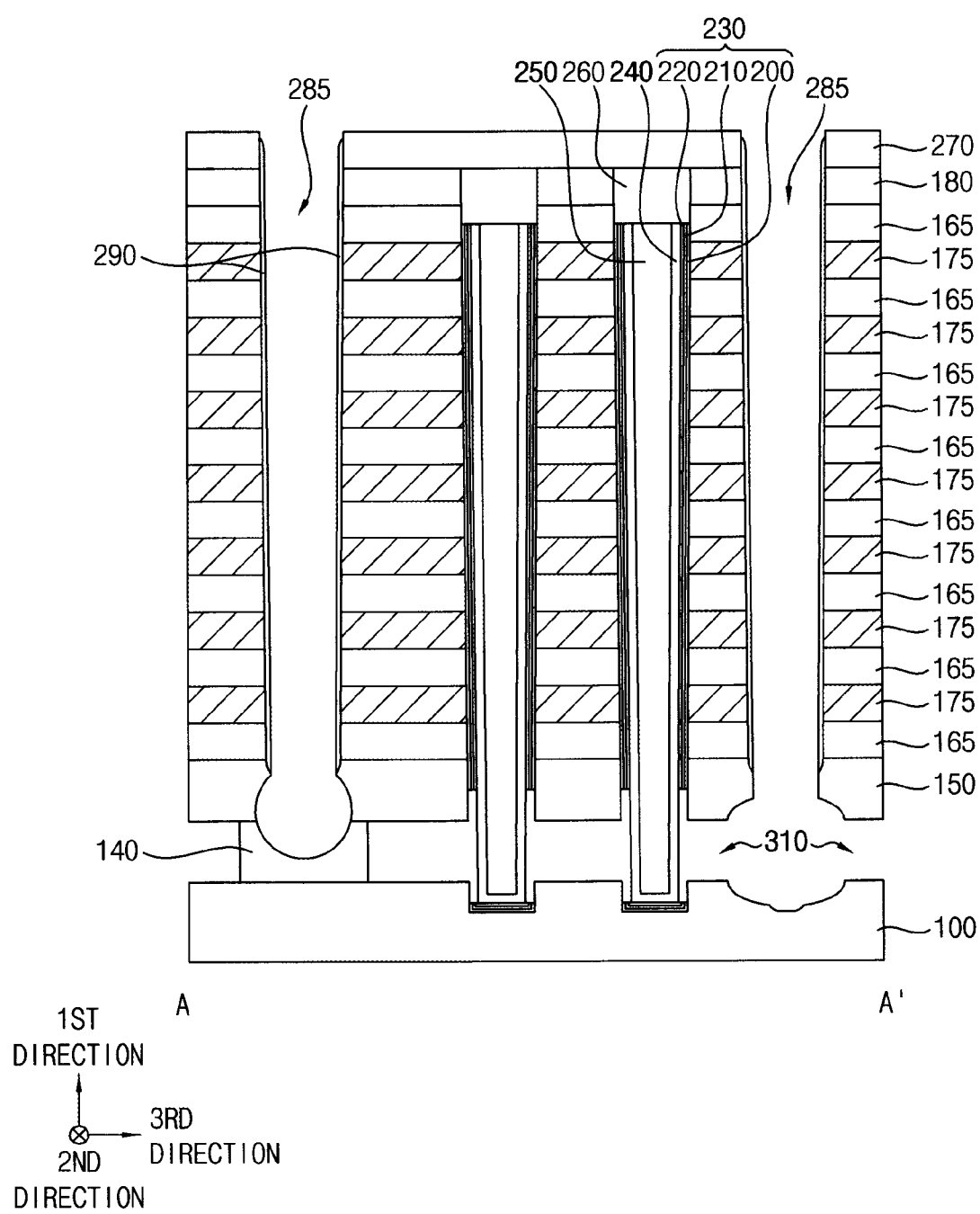

FIGS. 30 and 31 are cross-sectional views illustrating a method of manufacturing a vertical memory device in accordance with example embodiments of the inventive concept. This method may include processes substantially the same as or similar to those illustrated with reference to FIGS. 4 to 21 and FIGS. 1 to 3, and thus detailed descriptions thereof are omitted herein.

Referring to FIG. 30, processes substantially the same as or similar to those illustrated with reference to FIGS. 4 to 14 may be performed.

An oxidation process may be performed on layer structures including exposed silicon, that is, a lower surface and a sidewall of the support layer 150, an upper surface of the substrate 100 and a surface of the first spacer 290, so that first and second silicon oxide layers 500 and 510 may be formed.

The first silicon oxide layer 500 may be formed on the support layer 150 and the first spacer 290 to extend in the first direction, and the second silicon oxide layer 510 may be formed on the substrate 100.

Referring to FIG. 31, processes substantially the same as or similar to illustrated with reference to FIG. 15 may be performed to remove the first to third sacrificial layers 110, 120 and 130, and the first and second silicon oxide layers 500 and 510 may be also removed.

Processes substantially the same as or similar to illustrated with reference to FIGS. 16 to 21 and FIGS. 1 to 3 may be performed to complete the fabrication of the vertical memory device that may be substantially the same as that of FIGS. 1 to 3.

Figure 32:
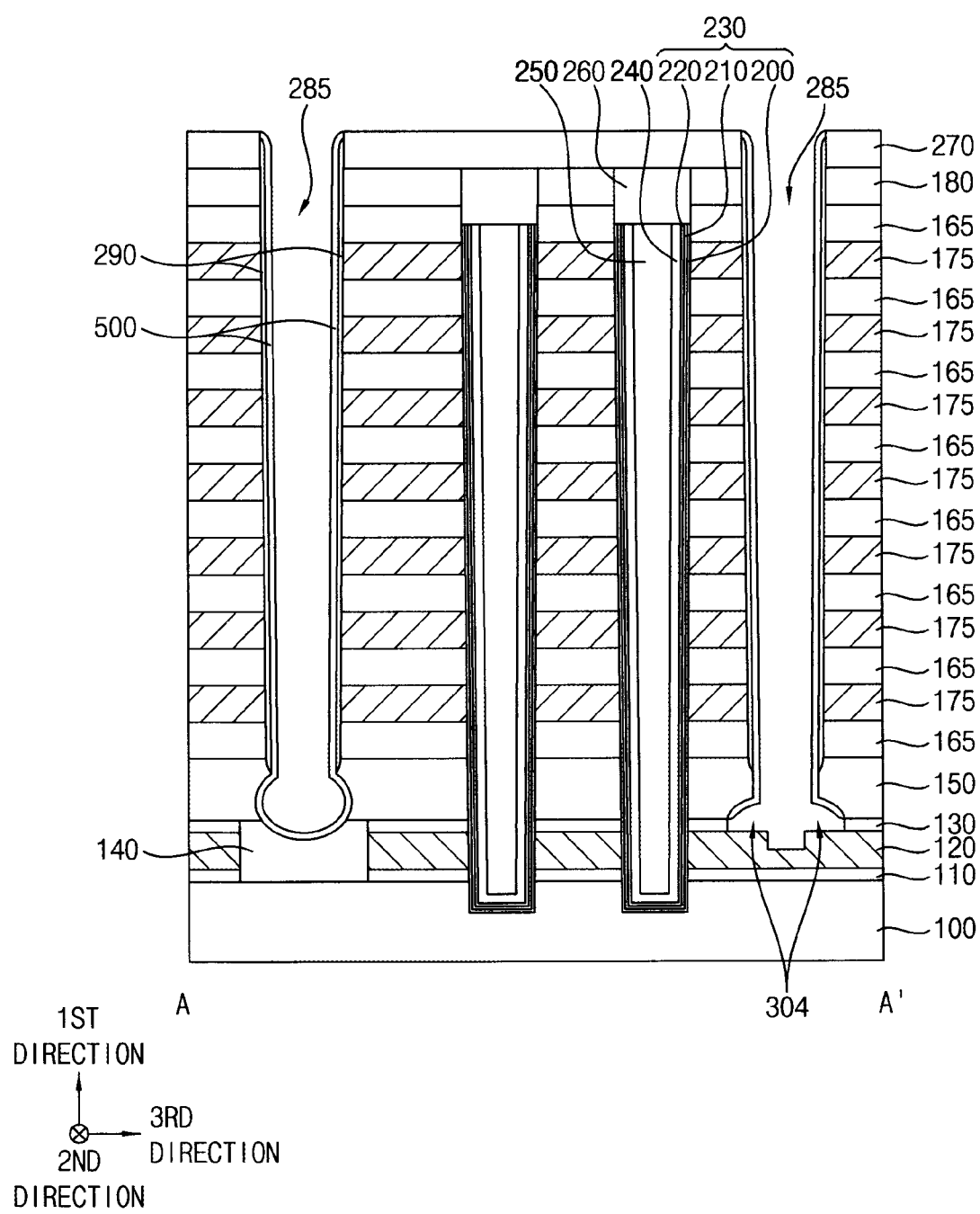
FIGS. 32 and 33 are cross-sectional views illustrating a method of manufacturing a vertical memory device in accordance with further example embodiments of the inventive concept.
Figure 33:
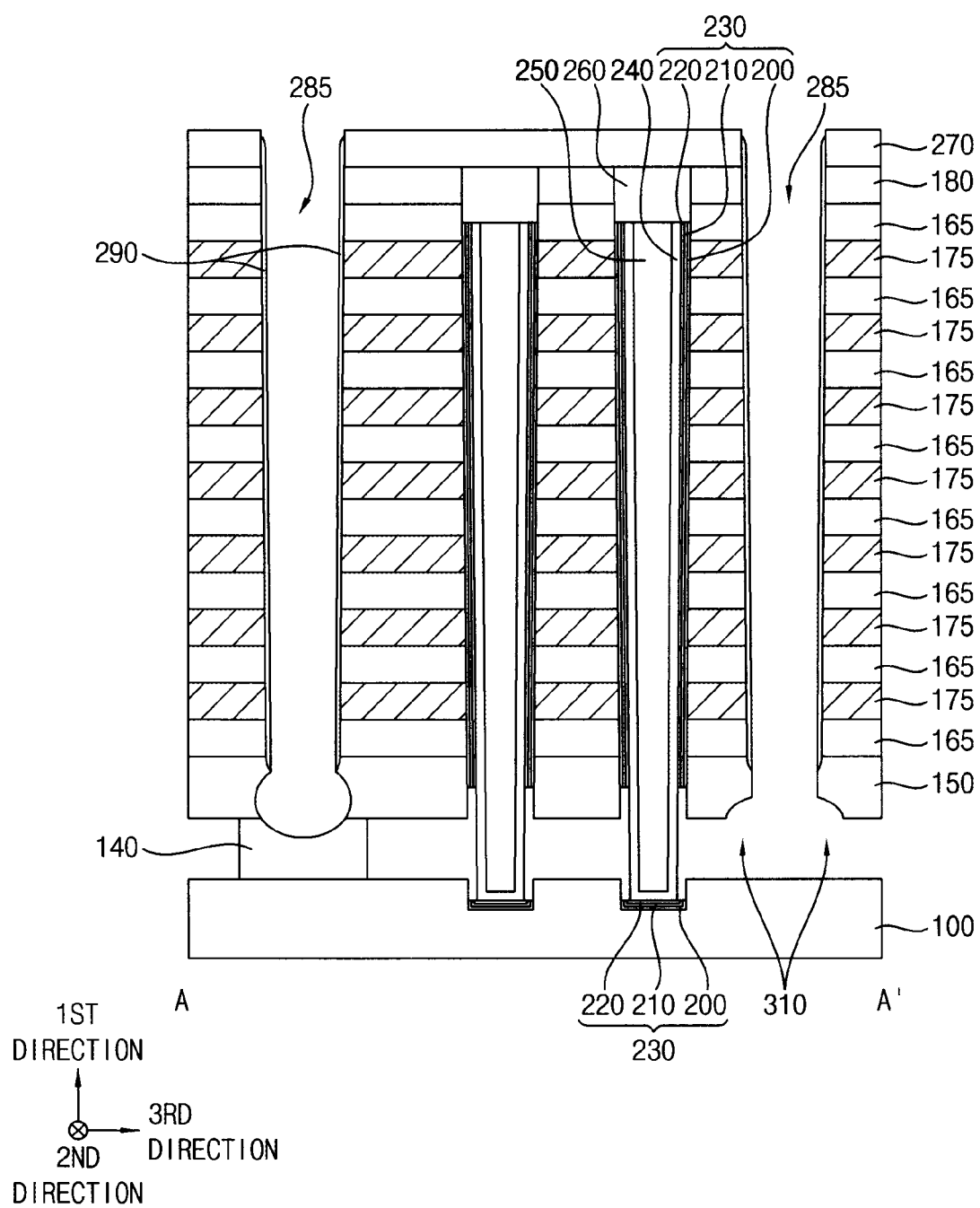

FIGS. 32 and 33 are cross-sectional views illustrating a method of manufacturing a vertical memory device in accordance with example embodiments. This method may include processes substantially the same as or similar to those illustrated with reference to FIGS. 23 to 26 and FIG. 22, and thus detailed descriptions thereon are omitted herein.

Referring to FIG. 32, processes substantially the same as or similar to those illustrated with reference to FIGS. 23 to 24 may be performed.

The oxidation process may be performed on the layer structures including exposed silicon, that is, the lower surface and the sidewall of the support layer 150 and the surface of the first spacer 290, so that the first silicon oxide layer 500 may be formed.

Referring to FIG. 33, processes substantially the same as or similar to illustrated with reference to FIG. 25 may be performed to remove the first to third sacrificial layers 110, 120 and 130, and the first silicon oxide layer 500 may be also removed.

Processes substantially the same as or similar to those illustrated with reference to FIGS. 26 and 22 may be perforated to complete the fabrication of the vertical memory device that may be substantially the same as that of FIG. 22.

Figure 34:
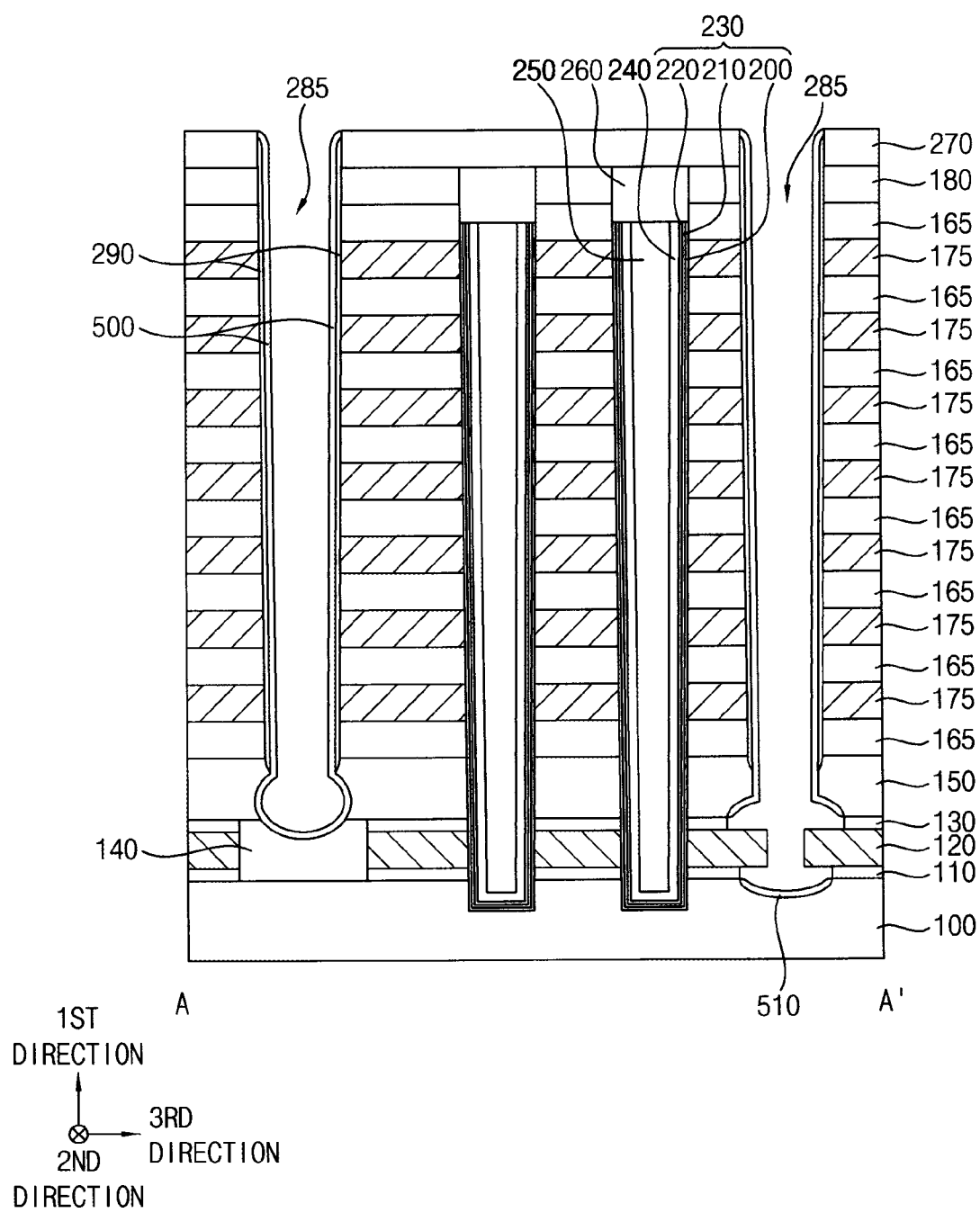
FIGS. 34 and 35 are cross-sectional views illustrating a method of manufacturing a vertical memory device in accordance with further example embodiments of the inventive concept.
Figure 35:
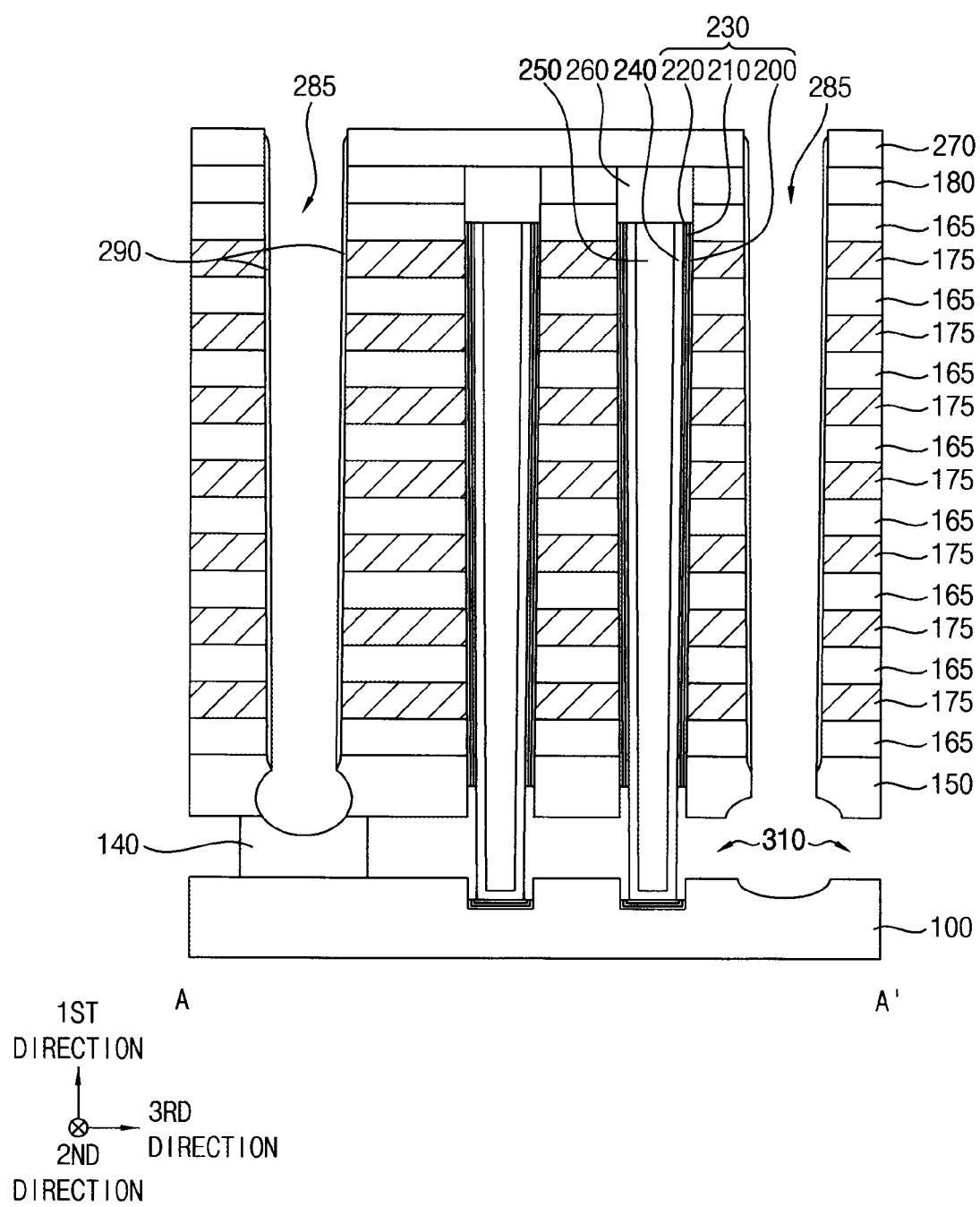

FIGS. 34 and 35 are cross-sectional views illustrating a method of manufacturing a vertical memory device in accordance with example embodiments of the inventive concept. This method may include processes substantially the same as or similar to those illustrated with reference to FIGS. 28 to 29 and FIGS. 27A and 27B, and thus detailed descriptions thereof are omitted herein.

Referring to FIG. 34, processes substantially the same as or similar to those illustrated with reference to FIGS. 29 to 29 may be performed.

The oxidation process may be performed on the layer structures including exposed silicon, that is, the lower surface and the sidewall of the support layer 150, the upper surface of the substrate 100, and the surface of the first spacer 290, so that the first and second silicon oxide layers 500 and 510 may be formed.

Referring to FIG. 35, processes substantially the same as or similar to illustrated with reference to FIGS. 27A and 27B may be performed to complete the fabrication of the vertical memory device.

Figure 36:
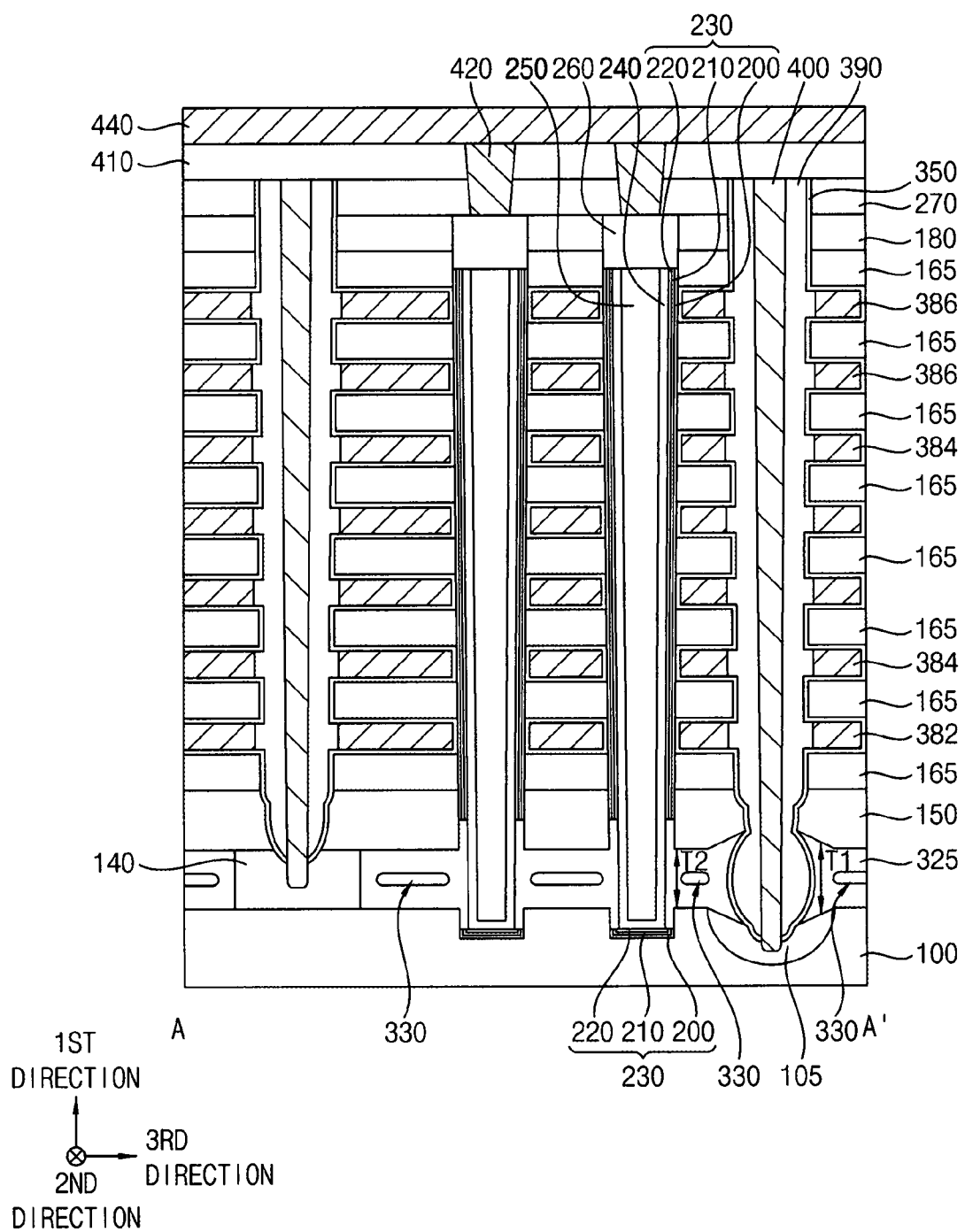
FIG. 36 is a cross-sectional view illustrating a vertical memory device in accordance with further example embodiments of the inventive concept.

FIG. 36 is a cross-sectional view illustrating a vertical memory device in accordance with example embodiments of the inventive concept. This vertical memory device may be substantially the same as or similar to that illustrated with reference to FIGS. 1 to 3, except for the shape of the channel connecting pattern 325, and, thus, detailed descriptions thereof are omitted herein.

Referring to FIG. 36, in example embodiments, the first thickness T1 in the first direction of an end portion of the channel connecting pattern 325 may be greater than the second thickness T2 in the first direction of other portions thereof except for a portion thereof immediately adjacent the channel 240.

In example embodiments, the end portion of the channel connecting pattern 325 may include an upper surface having a slope of which an absolute value may be substantially constant in the third direction. Additionally, the end portion of the channel connecting pattern 325 may include a lower surface having a slope of which an absolute value may be substantially constant in the third direction. Accordingly, the upper and lower surfaces of the end portion of the channel connecting pattern 325 may not be a curved surface but a flat planar surface having slopes that diverge from one another with increasing proximity to the CSL 400.

Figure 37:
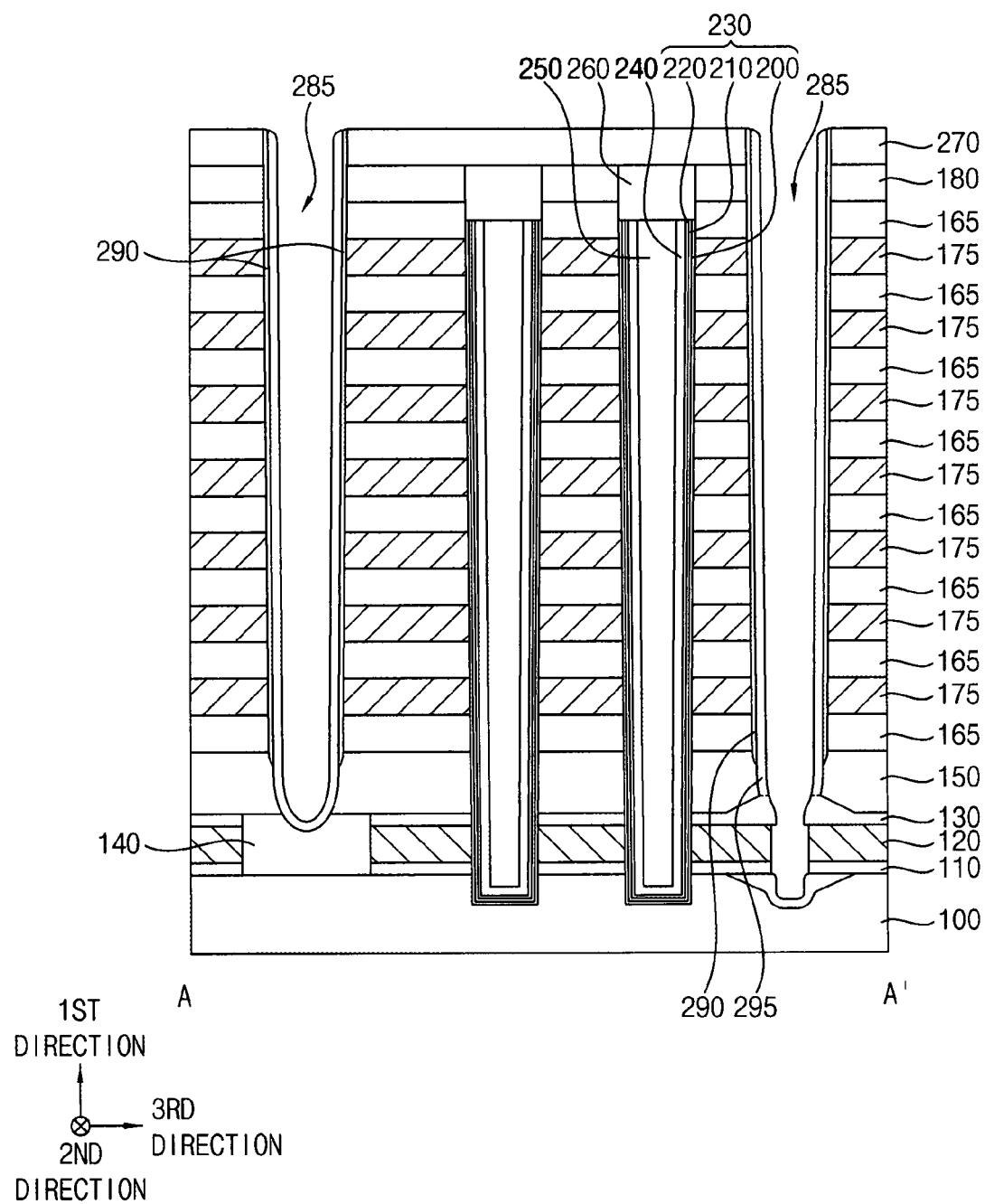
FIGS. 37 and 38 are cross-sectional views illustrating a method of manufacturing a vertical memory device in accordance with further example embodiments of the inventive concept.
Figure 38:
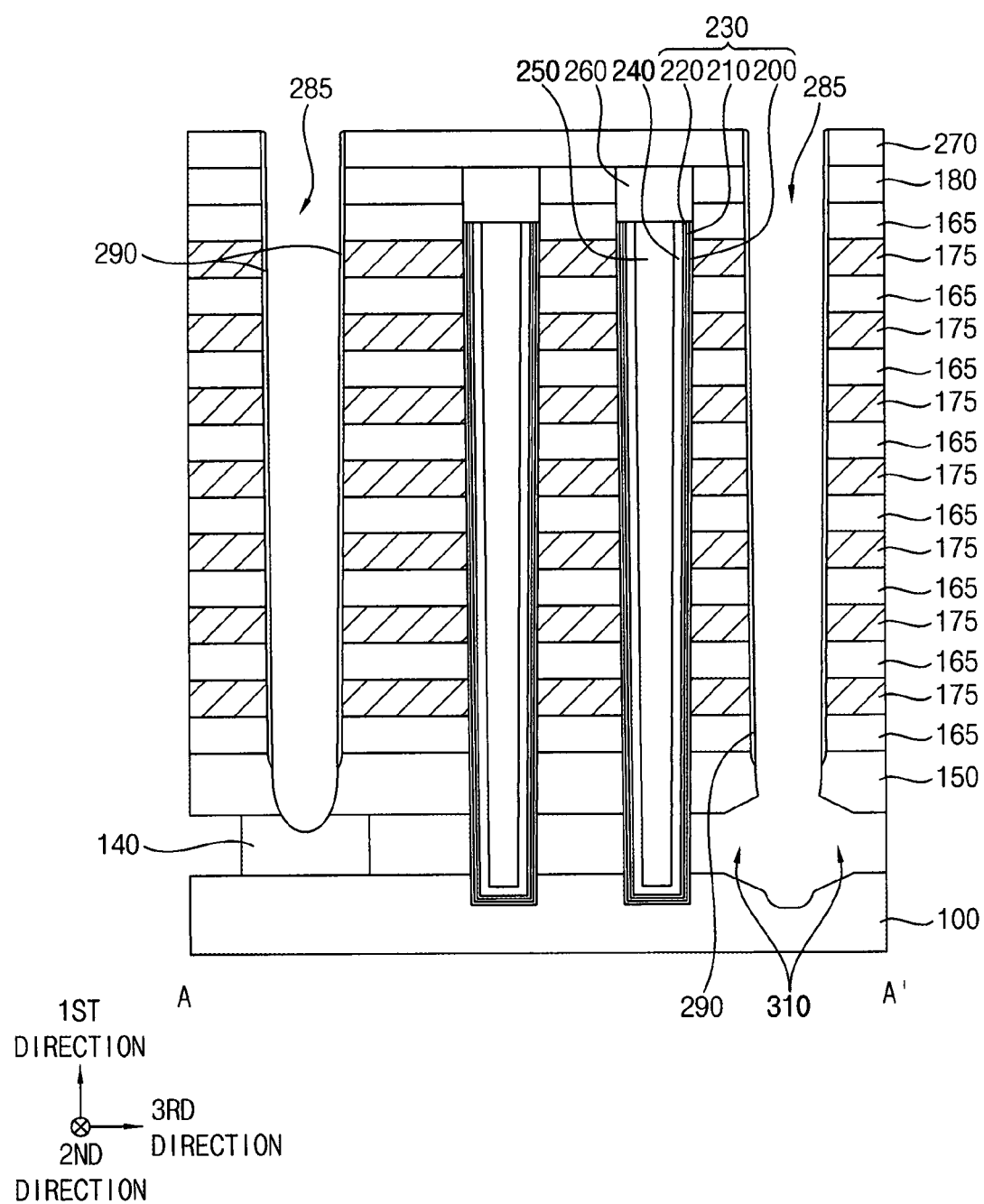

FIGS. 37 and 38 are cross-sectional views illustrating a method of manufacturing a vertical memory device in accordance with example embodiments of the inventive concept. This method may include processes substantially the same as or similar to those illustrated with reference to FIGS. 4 to 21 and FIGS. 1 to 3, and thus detailed descriptions thereof are omitted herein.

Referring to FIG. 37, processes substantially the same as or similar to those illustrated with reference to FIGS. 4 to 12 may be performed.

For example, a wet oxidation process may be performed so that layers including polysilicon or single crystalline silicon may be oxidized. Thus, an upper portion of the substrate 100, an upper portion of the support pattern 140 and a lower portion of the support layer 150 exposed by the third opening 285 and a surface of the first spacer 290 may be oxidized.

In example embodiments, the upper portion of the substrate 100 adjacent the third opening 285 may be oxidized to be merged with the first sacrificial layer 110, and the lower portion of the support layer 150 adjacent the third opening 285 may be oxidized to be merged with the third sacrificial layer 130. Thus, a width in the first direction of the merged first sacrificial layer 110 may gradually increase when approaching the third opening 285 in the third direction. In example embodiments, a slope of a lower surface of a portion of the merged first sacrificial layer 110 having the increasing width may be substantially constant. Likewise, a width in the first direction of the merged third sacrificial layer 130 may gradually increase when approaching the third opening 285 in the third direction. In example embodiments, a slope of an upper surface of a portion of the merged third sacrificial layer 130 having the increasing width may be substantially constant.

The surface of the first spacer 290 may be oxidized to be transformed into a sacrificial spacer 295.

Referring to FIG. 38, processes substantially the same as or similar to those illustrated with reference to FIG. 15 may be performed.

Thus, after removing the first and third sacrificial layers 110 and 130 and the sacrificial spacer 295, the second sacrificial layer 120 may be removed to form the third gap 310.

As illustrated with respect to FIG. 37, widths of the portions of the first and third sacrificial layers 110 and 130 adjacent the third opening 284 have increased, and thus a width in the first direction of a portion of the third gap 310 adjacent the third opening 285 may be greater than a width in the first direction of other portions of the third gap 310 except for a portion thereof adjacent the channel 240.

Referring again to FIG. 36, processes substantially the same as or similar to those illustrated with reference to FIGS. 17 to 21 and FIGS. 1 to 3 may be performed to complete the fabrication of the vertical memory device.

While example embodiments have been particularly shown and described, it will be understood by one of ordinary skill in the art that variations in form and detail may be made therein without departing from the spirit and scope of the claims.

What is claimed is:

1. A vertical memory device comprising:
a channel connecting pattern on a substrate;
a support layer on the channel connecting pattern;
a gate stack on the support layer, the gate stack including:
gate electrodes spaced apart from each other in a first direction, each of the gate electrodes extending in a second direction substantially parallel to an upper surface of the substrate, and the first direction being substantially perpendicular to the upper surface of the substrate; and
an insulation pattern between neighboring ones of the gate electrodes in the first direction;
a channel extending in the first direction through the gate stack, the support layer and the channel connecting pattern; and
a blocking pattern on lower and upper surfaces and a sidewall facing the channel of each of the gate electrodes, wherein:
each of the gate stack, the support layer and the channel connecting pattern is divided in a third direction by an opening extending in the second direction on the substrate, the third direction being substantially parallel to the upper surface of the substrate and substantially perpendicular to the second direction,
a portion of the blocking pattern is on a sidewall of the channel connecting pattern exposed by the opening, and
the sidewall of the channel connecting pattern exposed by the opening is concave toward a central portion of the opening in the third direction.

2. The vertical memory device of claim 1, wherein a portion of the blocking pattern is on a sidewall of the insulation pattern exposed by the opening, the portion being substantially flat toward the central portion of the opening in the third direction.

3. The vertical memory device of claim 1, wherein a portion of the blocking pattern is on a sidewall of the support layer exposed by the opening.

4. The vertical memory device of claim 1, wherein each of the channel connecting pattern and the support layer comprises doped polysilicon.

5. The vertical memory device of claim 1, wherein the channel is one of a plurality of channels in each of the second and third directions, and
wherein the channel connecting pattern connects the plurality of channels with each other.

6. The vertical memory device of claim 1, further comprising:
a common source line (CSL) extending in the second direction in the opening on the substrate; and
a spacer in the opening, the spacer being on a sidewall in the third direction of the CSL,
wherein a bottom portion of the spacer facing the channel connecting pattern has a convex sidewall in the third direction.

7. The vertical memory device of claim 6, wherein the portion of the blocking pattern on the sidewall of the channel connecting pattern physically contacts the bottom portion of the spacer.

8. The vertical memory device of claim 1, further comprising a charge storage structure on at least a portion of an outer sidewall of the channel.

9. The vertical memory device of claim 8, wherein the channel connecting pattern is on a portion of the outer sidewall of the channel, and physically contacts the charge storage structure.

10. A vertical memory device comprising:
a channel connecting pattern on a substrate;
a support layer on the channel connecting pattern;
a gate stack on the support layer, the gate stack including:
gate electrodes spaced apart from each other in a first direction, each of the gate electrodes extending in a second direction substantially parallel to an upper surface of the substrate, and the first direction being substantially perpendicular to the upper surface of the substrate; and
an insulation pattern between neighboring ones of the gate electrodes in the first direction; and
a channel extending in the first direction through the gate stack, the support layer and the channel connecting pattern,
wherein each of the gate stack, the support layer and the channel connecting pattern is divided in a third direction by an opening extending in the second direction on the substrate, the third direction being substantially parallel to the upper surface of the substrate and substantially perpendicular to the second direction, and
wherein a portion of the opening adjacent to a sidewall of the channel connecting pattern has a width in the third direction that is greater than a width in the third direction of a portion of the opening adjacent to a sidewall of the support layer.

11. The vertical memory device of claim 10, wherein the portion of the opening adjacent to the sidewall of the channel connecting pattern has a maximum width in the third direction at a height of a central portion of the channel connecting pattern in the first direction.

12. The vertical memory device of claim 10, further comprising:
a common source line (CSL) extending in the second direction in the opening on the substrate; and a spacer in the opening, the spacer being on a sidewall in the third direction of the CSL,
wherein a bottom portion of the spacer facing the channel connecting pattern has a convex sidewall in the third direction.

13. The vertical memory device of claim 10, further comprising a charge storage structure on at least a portion of an outer sidewall of the channel,
wherein the channel connecting pattern is on a portion of the outer sidewall of the channel.

14. The vertical memory device of claim 13, wherein the bottom portion of the spacer having the convex sidewall at least partially overlaps the portion of the outer sidewall of the channel having the channel connecting pattern thereon in the third direction.

15. A vertical memory device comprising:
a substrate;
a channel connecting pattern on the substrate;
a support layer on the channel connecting pattern;
gate electrodes spaced apart from each other in a first direction on the support layer, each of the gate electrodes extending in a second direction substantially parallel to an upper surface of the substrate, and the first direction being substantially perpendicular to the upper surface of the substrate;
a channel extending in the first direction through the gate electrodes, the support layer and the channel connecting pattern on the substrate;
a common source line (CSL) extending in the second direction on the substrate, the CSL dividing each of the gate electrodes in a third direction substantially parallel to the upper surface of the substrate and substantially perpendicular to the second direction; and
a spacer on a sidewall in the third direction of the CSL, a bottom portion of the spacer having a convex sidewall in the third direction.

16. The vertical memory device of claim 15, wherein the bottom portion of the spacer overlaps the channel connecting pattern in the third direction.

17. The vertical memory device of claim 15, further comprising a charge storage structure on at least a portion of an outer sidewall of the channel,
wherein the channel connecting pattern is on a portion of the outer sidewall of the channel, and physically contacts the charge storage structure.

18. The vertical memory device of claim 15, wherein each of the channel connecting pattern and the support layer comprises doped polysilicon.

19. The vertical memory device of claim 15, further comprising a blocking pattern covering lower and upper surfaces and a sidewall facing the channel of each of the gate electrodes and a sidewall of the spacer.

20. The vertical memory device of claim 19, wherein a portion of the blocking pattern on the sidewall of the spacer physically contacts the channel connecting pattern.

* * * * *